United States Patent
Sugahara

(10) Patent No.: US 11,423,958 B2
(45) Date of Patent: Aug. 23, 2022

(54) SEMICONDUCTOR MEMORY DEVICE HAVING A FIRST PLANE AND A SECOND PLANE INCLUDING RESPECTIVE LATCH CIRCUITS, AND FIRST AND SECOND FIFO CIRCUITS FOR FETCHING READ DATA FROM THE LATCH CIRCUITS

(71) Applicant: Kioxia Corporation, Tokyo (JP)

(72) Inventor: Akio Sugahara, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/164,273

(22) Filed: Feb. 1, 2021

(65) Prior Publication Data
US 2021/0335398 A1 Oct. 28, 2021

(30) Foreign Application Priority Data
Apr. 24, 2020 (JP) .............................. JP2020-077627

(51) Int. Cl.
G11C 7/10 (2006.01)
(52) U.S. Cl.
CPC ............ *G11C 7/1039* (2013.01); *G11C 7/106* (2013.01); *G11C 7/1063* (2013.01); *G11C 7/1087* (2013.01)
(58) Field of Classification Search
CPC ..... G11C 7/1039; G11C 7/106; G11C 7/1063; G11C 7/1087
See application file for complete search history.

(56) References Cited

U.S. PATENT DOCUMENTS

| | | | |
|---|---|---|---|
| 8,149,622 B2 | 4/2012 | Lee et al. | |
| 10,249,377 B2 | 4/2019 | Kasai et al. | |
| 10,504,598 B2* | 12/2019 | Uehara | G11C 16/0483 |
| 10,860,250 B2 | 12/2020 | Sugahara et al. | |
| 2017/0199666 A1 | 7/2017 | Sundaram et al. | |
| 2019/0080763 A1 | 3/2019 | Kajiyama et al. | |
| 2019/0198120 A1 | 6/2019 | Handa et al. | |
| 2020/0202958 A1 | 6/2020 | Sugahara et al. | |
| 2021/0103407 A1* | 4/2021 | Na | G11C 16/32 |

FOREIGN PATENT DOCUMENTS

| | | |
|---|---|---|
| JP | 2012532373 A | 12/2012 |
| JP | 2019505910 A | 2/2019 |
| JP | 2019117676 A | 7/2019 |

OTHER PUBLICATIONS

U.S. Appl. No. 17/091,005; First Named Inventor: Akio Sugahara; Title: "Memory Device"; Filed: Nov. 6, 2020.
U.S. Appl. No. 17/168,822; First Named Inventor: Akio Sugahara; Title: "Memory Device Which Generates Operation Voltages in Parallel With Reception of an Address"; Filed: Feb. 5, 2021.

* cited by examiner

*Primary Examiner* — Vanthu T Nguyen
(74) *Attorney, Agent, or Firm* — Holtz, Holtz & Volek PC

(57) ABSTRACT

According to one embodiment, a semiconductor memory device includes: a first plane PL0 including a first memory cell array 57A, and a first latch circuit 60A configured to store first read data read from the first memory cell array 57A; a second plane PL1 including a second memory cell array 57B, and a second latch circuit 60B configured to store second read data read from the second memory cell array 57B; and an I/O circuit 11 including a first FIFO circuit 14A configured to fetch the first read data from the first latch circuit 60A, and a second FIFO circuit 14B configured to fetch the second read data from the second latch circuit 60B.

15 Claims, 18 Drawing Sheets

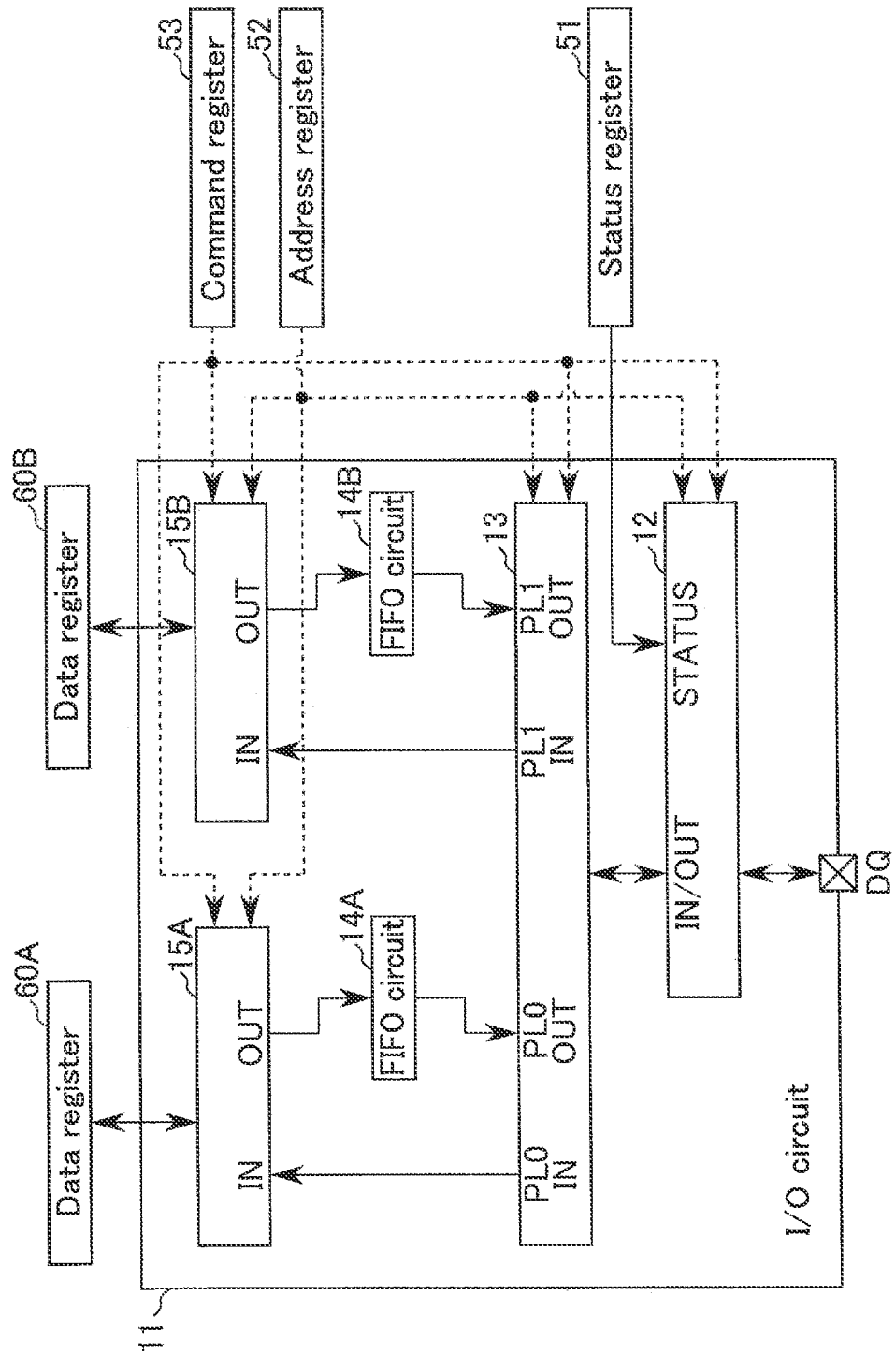
F I G. 4

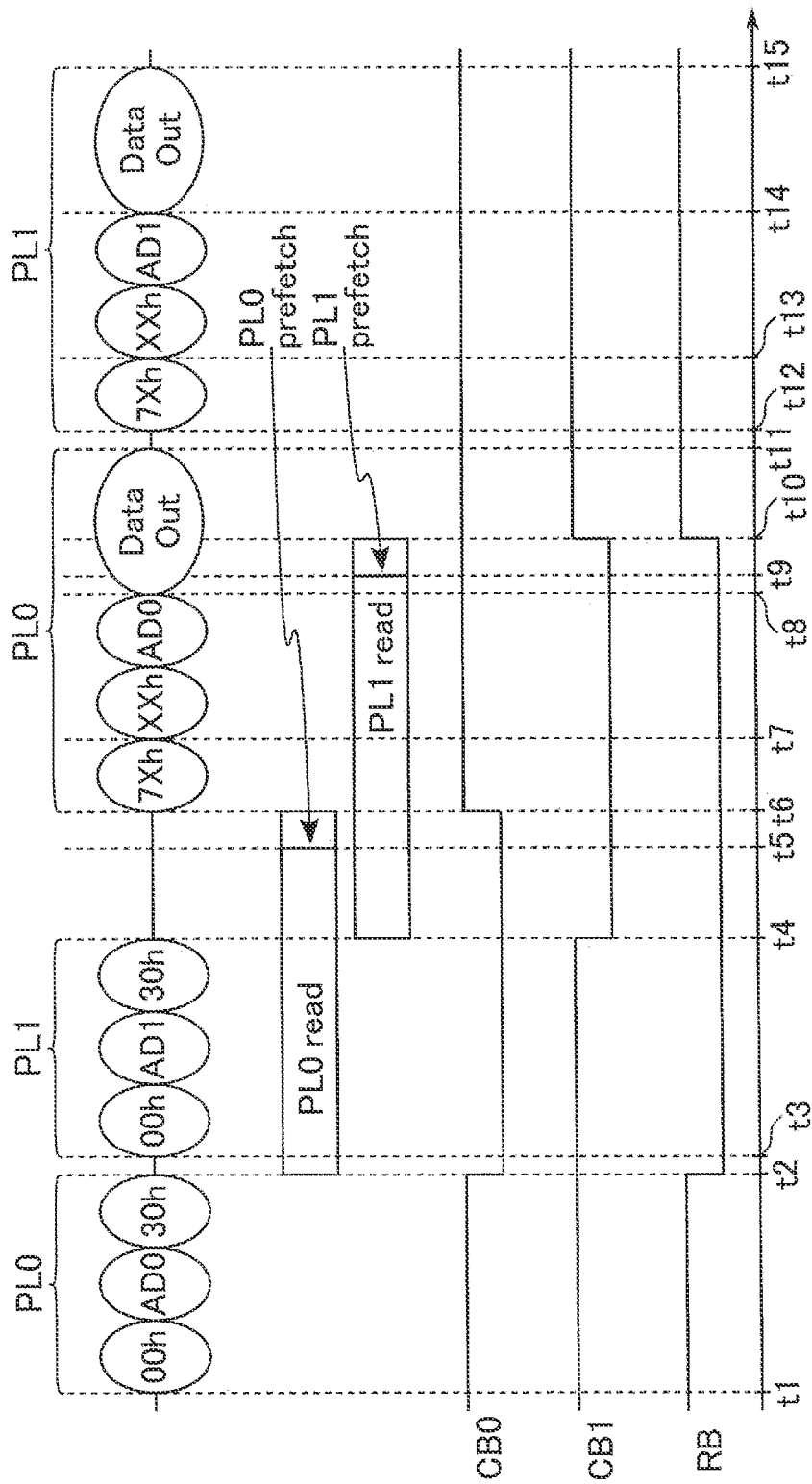
F I G. 6

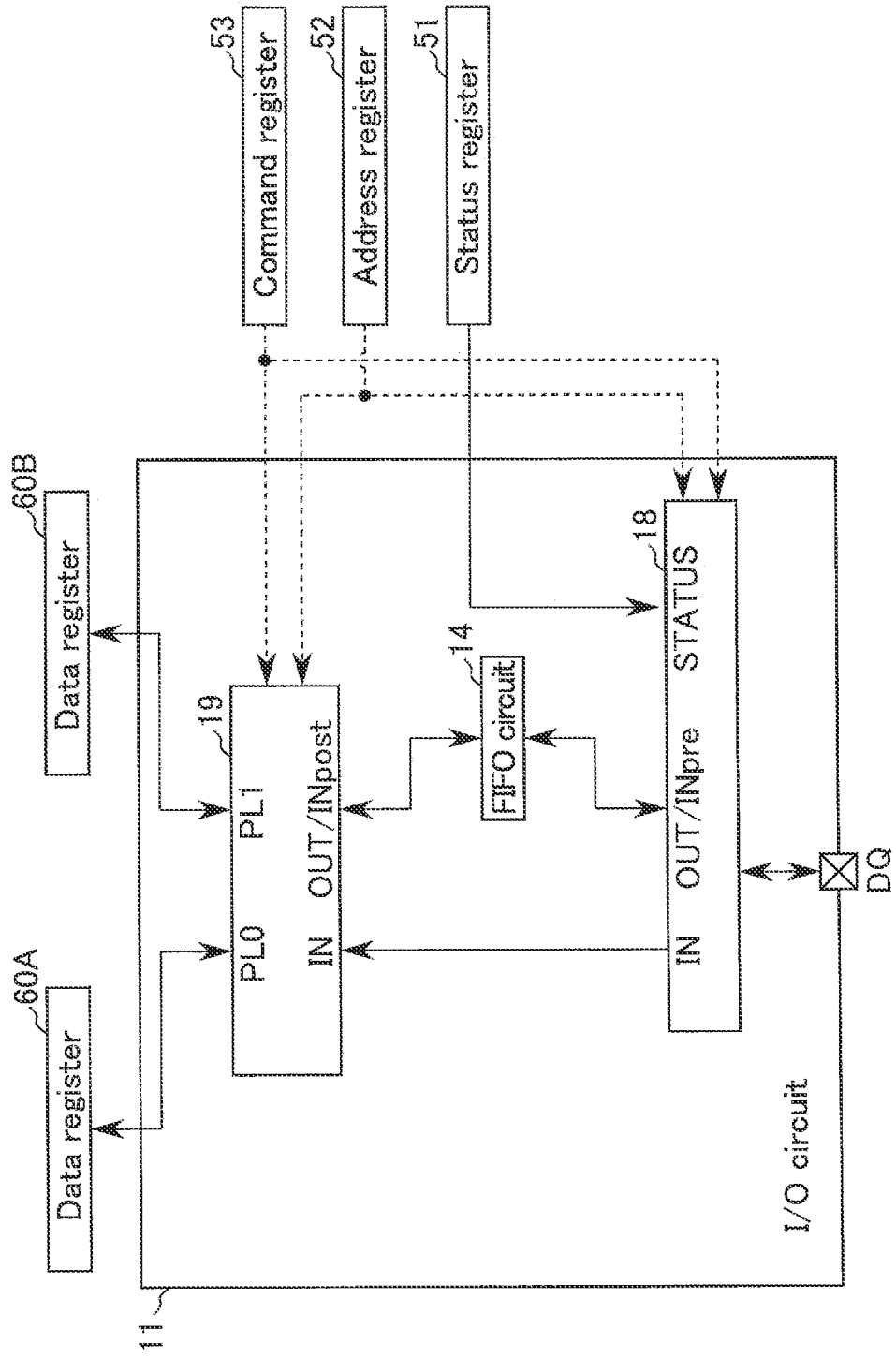
F I G. 12

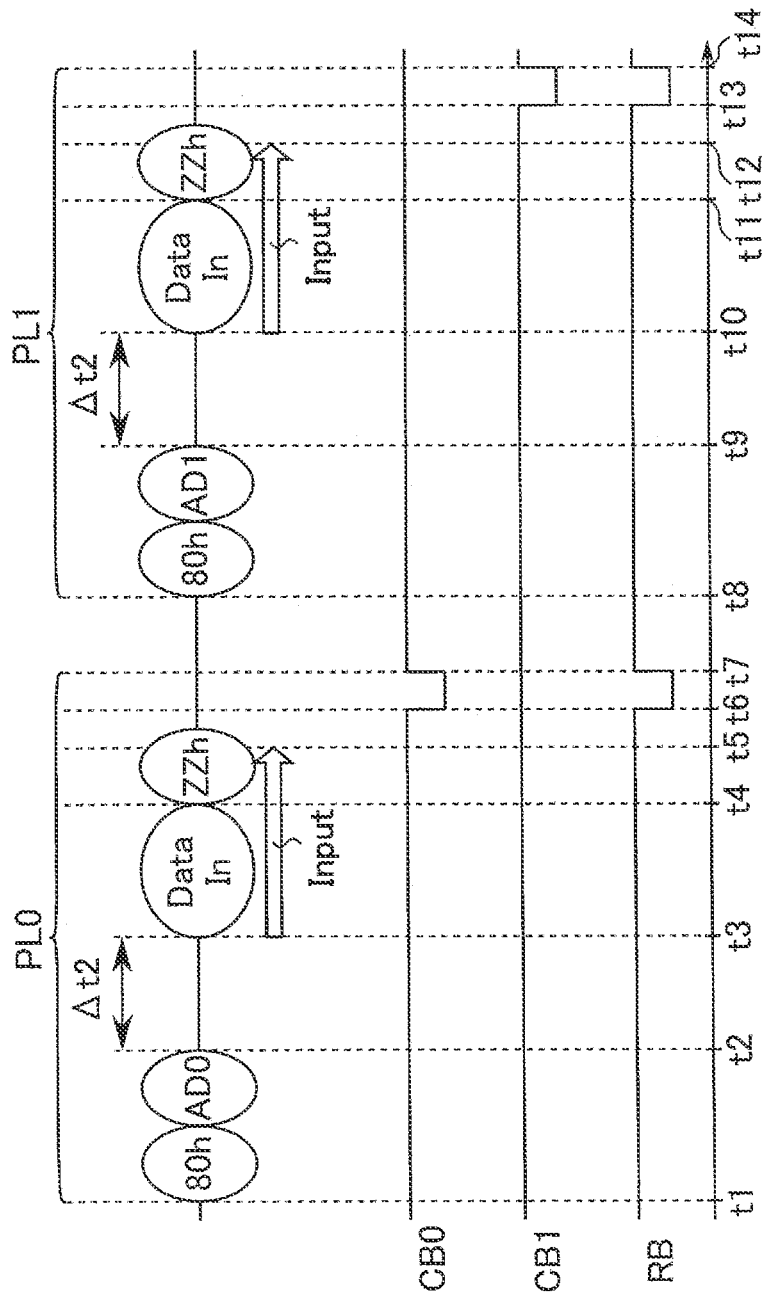
F I G. 15

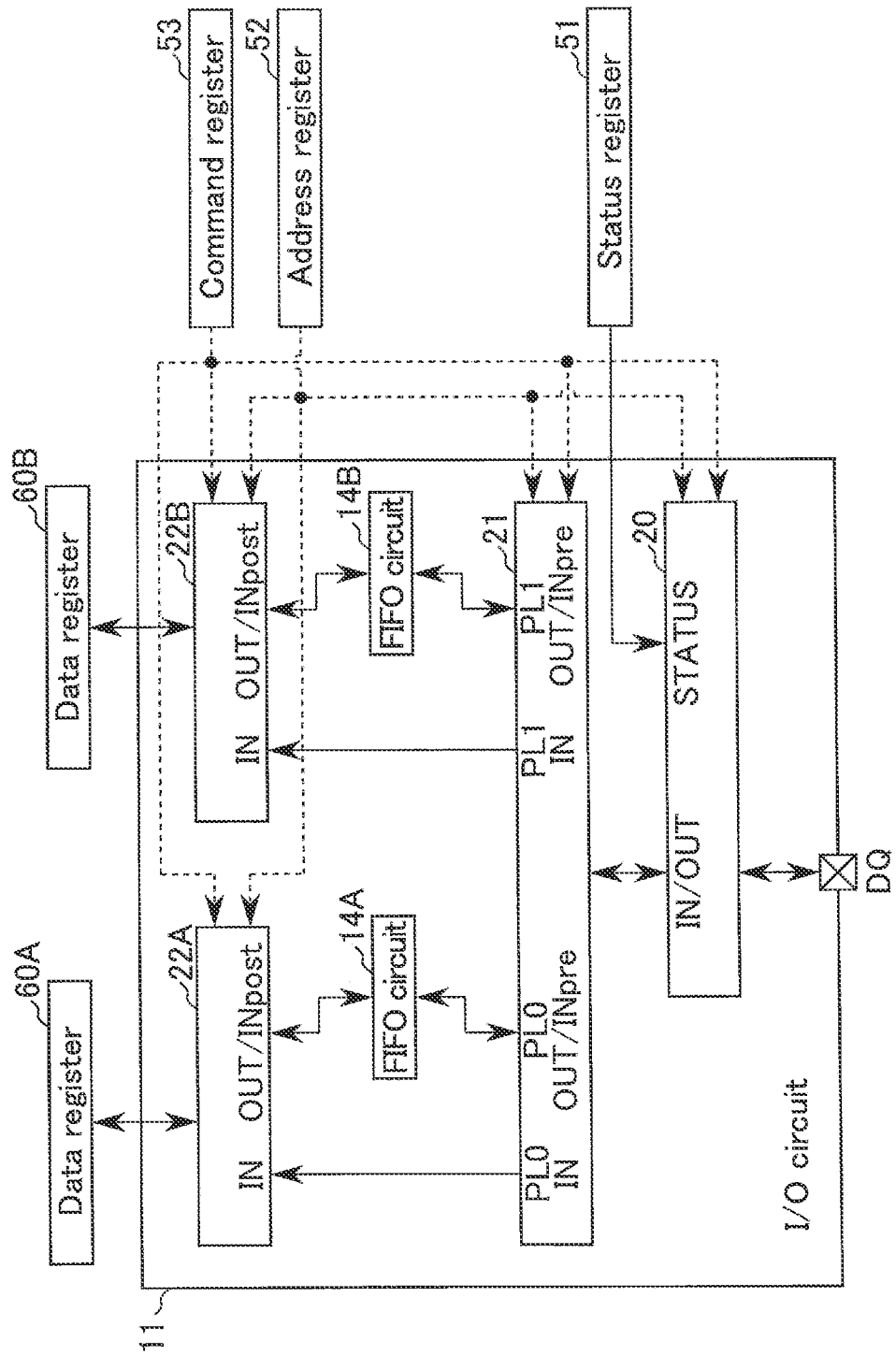
F I G. 16

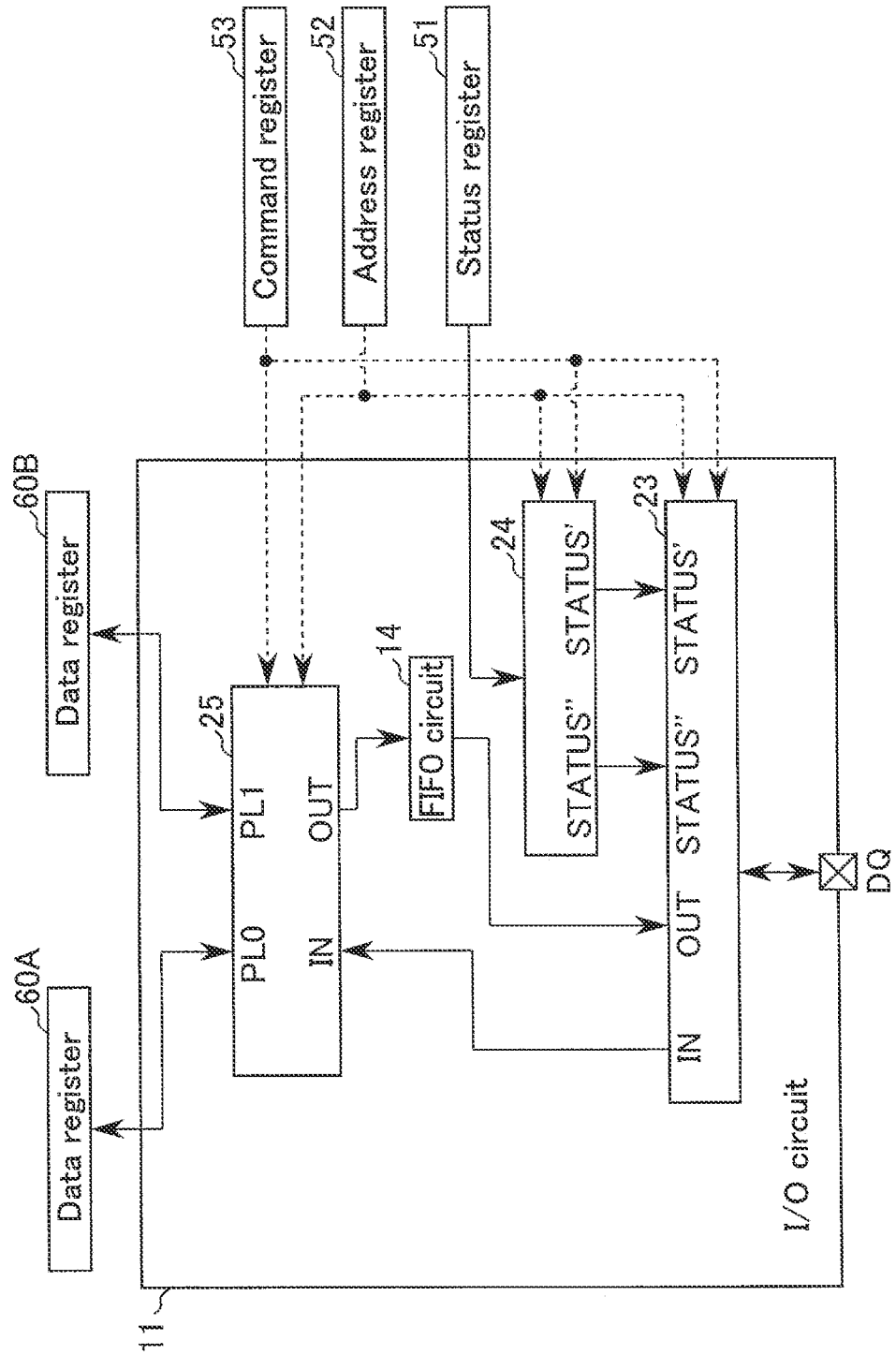
F I G. 17

SEMICONDUCTOR MEMORY DEVICE HAVING A FIRST PLANE AND A SECOND PLANE INCLUDING RESPECTIVE LATCH CIRCUITS, AND FIRST AND SECOND FIFO CIRCUITS FOR FETCHING READ DATA FROM THE LATCH CIRCUITS

CROSS-REFERENCE TO RELATED APPLICATIONS

This application is based upon and claims the benefit of priority from Japanese Patent Application No. 2020-077627, filed Apr. 24, 2020, the entire contents of which are incorporated herein by reference.

FIELD

Embodiments described herein relate generally to a semiconductor memory device.

BACKGROUND

As a semiconductor memory device, NAND flash memories are known.

BRIEF DESCRIPTION OF THE DRAWINGS

FIG. 4 is a circuit diagram showing an input/output (I/O) circuit included in the semiconductor memory device according to the first embodiment.

FIG. 6 is a timing chart of a command sequence and various signals during a read operation of the semiconductor memory device according to the first embodiment.

FIG. 12 is a circuit diagram showing an I/O circuit included in a semiconductor memory device according to a second embodiment.

FIG. 15 is a diagram illustrating a period during which a clear operation of a data register is performed.

FIG. 16 is a circuit diagram showing an I/O circuit included in a semiconductor memory device according to a modification of the second embodiment.

FIG. 17 is a circuit diagram showing an I/O circuit included in a semiconductor memory according to a third embodiment.

DETAILED DESCRIPTION

Figure 1:
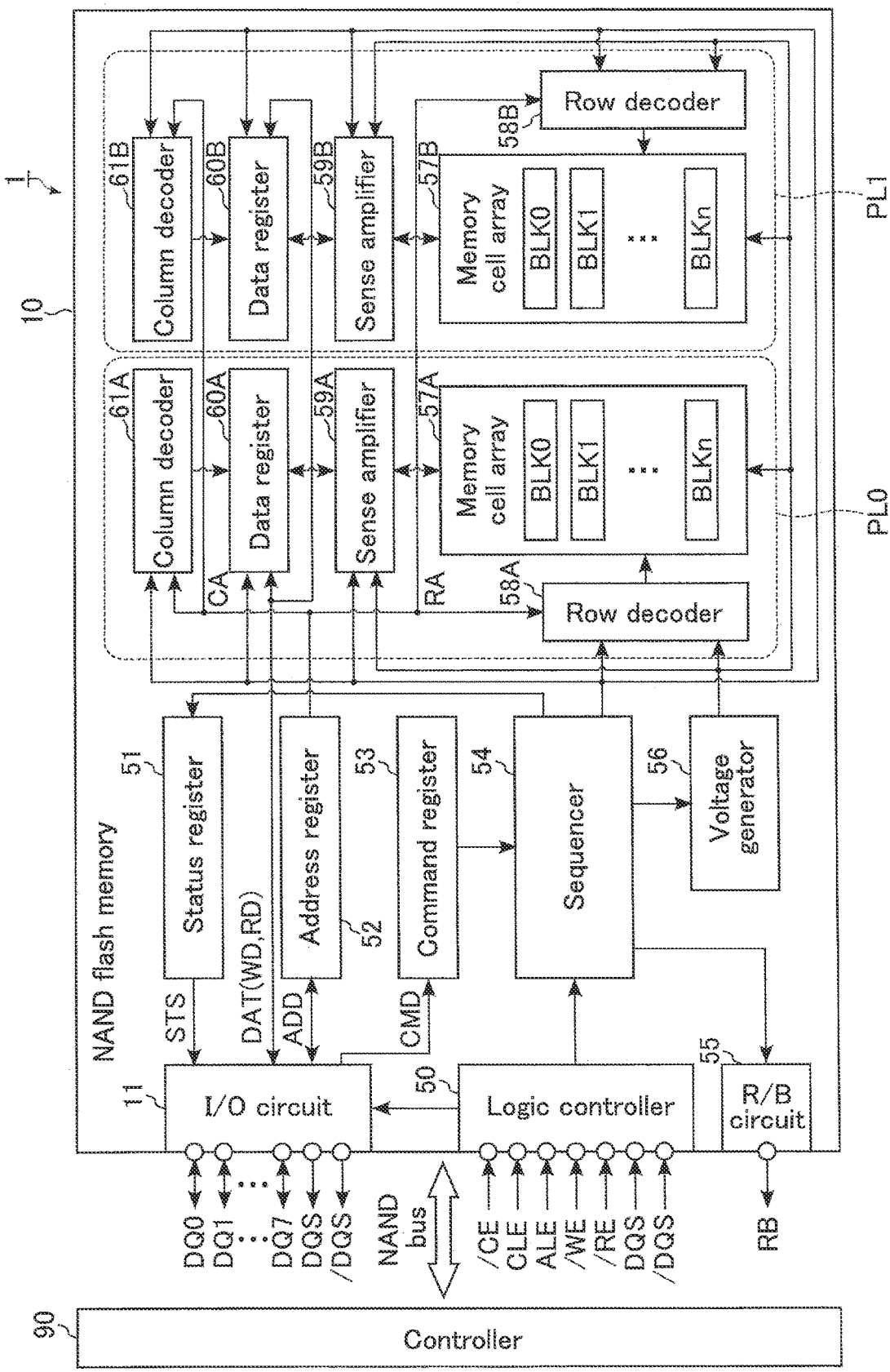
FIG. 1 is a block diagram of a memory system according to a first embodiment.

In general, according to one embodiment, a semiconductor memory device includes a first plane, a second plane, and an I/O circuit. The first plane includes a first memory cell array and a first latch circuit. The first memory cell array has a plurality of first memory cell transistors. The first latch circuit is configured to store first read data read from the first memory cell array. The second plane includes a second memory cell array and a second latch circuit. The second memory cell array has a plurality of second memory cell transistors. The second latch circuit is configured to store second read data read from the second memory cell array. The I/O circuit includes a first FIFO circuit and a second FIFO circuit. The first FIFO circuit is configured to fetch the first read data from the first latch circuit. The second FIFO circuit is configured to fetch the second read data from the second latch circuit.

Hereinafter, embodiments will be described with reference to the drawings. In the description, common parts are assigned common reference numerals throughout the drawings.

1. First Embodiment

A semiconductor memory device according to a first embodiment will be described. As an example of the semiconductor memory device, a three-dimensionally stacked NAND flash memory, in which memory cell transistors are three-dimensionally stacked above a semiconductor substrate, will be described below.

1.1 Configuration 1.1.1 Overall Configuration of Memory System

First, an overall configuration of a memory system including the semiconductor memory device according to the present embodiment will be described with reference to FIG. 1. FIG. 1 is a block diagram of the memory system according to the present embodiment.

As shown in FIG. 1, a memory system 1 includes a NAND flash memory 10 and a controller 90. The NAND flash memory 10 and the controller 90 in combination, for example, may constitute a single semiconductor memory device; examples of such a semiconductor memory device include a memory card such as an SD™ card and a solid state drive (SSD). A plurality of NAND flash memories 10 may be formed inside the memory system 1.

The NAND flash memory 10 includes a plurality of memory cells and stores data in a non-volatile manner. The controller 90 is coupled to the NAND flash memory 10 via a NAND bus. The controller 90 is coupled to a host device (not shown) via a host bus (not shown). The controller 90 controls the NAND flash memory 10. The controller 90 accesses the NAND flash memory 10, for example, in accordance with an order received from the host device. Examples of the host device include a digital camera and a personal computer. The host bus is, for example, an SD™ interface-compatible bus.

The NAND bus transmits and receives signals compatible with a NAND interface. Specific examples of these signals include a chip enable signal CE, a command latch enable signal CLE, an address latch enable signal ALE, a write enable signal WE, a read enable signal RE, a ready/busy signal RB, an input/output signal DQ, and a clock signal DQS and /DQS (an inversion signal of the signal DQS).

The chip enable signal CE is a signal for enabling the NAND flash memory 10, and is asserted at, for example, a low ("L") level. The term "assert" means that a signal (or logic) is in a valid (active) state. The opposite term "negate" means that a signal (or logic) is in an invalid (inactive) state. The command latch enable signal CLE is a signal indicating that the signal DQ is a command, and is asserted at, for example, a high ("H") level. The address latch enable signal ALE is a signal indicating that the signal DQ is an address, and is asserted at, for example, the "H" level. The write enable signal WE is a signal for fetching a received signal into the NAND flash memory 10, and is asserted at, for example, the "L" level every time the signal DQ is received from the controller 90. Accordingly, whenever the write enable signal WE is toggled, the NAND flash memory 10 fetches the signal DQ. The read enable signal RE is a signal for the controller 90 to read data from the NAND flash memory 10. The read enable signal RE is asserted at, for example, the "L" level. Accordingly, the NAND flash memory 10 outputs the signal DQ to the controller 90 based on a toggled read enable signal RE.

The ready/busy signal RB is a signal indicating whether the NAND flash memory 10 is in a busy state or in a ready state (whether or not a command can be received from the controller 90). For example, the ready/busy signal RB is set to the "L" level when the NAND flash memory 10 is in the busy state.

Examples of the input/output signal DQ include eight-bit signals DQ0 to DQ7 (hereinafter, these eight signals DQ will be respectively referred to as signals DQ0 to DQ7 when they are distinguished from each other, and will be simply referred to as signal DQ when they are not distinguished from each other). The input/output signal DQ is an entity of data transmitted and received between the NAND flash memory 10 and the controller 90. Examples of input/output signal DQ include a command, an address, write data, and read data. The clock signals DQS and /DQS control timing of transmitting and receiving of, for example, the signal DQ. For example, when data is written, the signals DQS and /DQS along with the write data DQ are transmitted from the controller 90 to the NAND flash memory 10. The signals DQS and /DQS are then toggled, and the NAND flash memory 10 receives the write data DQ, in synchronization with the signals DQS and /DQS. When data is read, the signals DQS and /DQS along with the read data DQ are transmitted from the NAND flash memory 10 to the controller 90. The signals DQS and /DQS are generated based on the aforementioned read enable signal RE. The signals DQS and /DQS are then toggled, and the controller 90 receives the read data DQ, in synchronization with the signals DQS and /DQS.

1.1.2 Configuration of NAND Flash Memory 10

The configuration of the NAND flash memory 10 according to the present embodiment will be described in detail by continuously referring to FIG. 1. In FIG. 1, some of the couplings between blocks are indicated by arrows; however, the couplings between the blocks are not limited to those shown in FIG. 1.

As shown in FIG. 1, the NAND flash memory 10 includes an I/O circuit 11, a logic controller 50, a status register 51, an address register 52, a command register 53, a sequencer 54, a ready/busy (R/B) circuit 55, a voltage generator 56, and planes PL0 and PL1.

The plane PL0 includes a memory cell array 57A, a row decoder 58A, a sense amplifier 59A, a data register 60A, and a column decoder 61A. The plane PL1 includes a memory cell array 57B, a row decoder 58B, a sense amplifier 59B, a data register 60B, and a column decoder 61B. Each of the planes PL0 and PL1 may be independently controlled by the sequencer 54.

The I/O circuit 11 controls input and output of the signal DQ as well as input and output of the signals DQS and /DQS to and from the controller 90. Specifically, the I/O circuit 11 includes an input circuit and an output circuit (both not shown). The input circuit transmits data DAT (write data WD) received from the controller 90 to each of the data registers 60A and 60B, transmits an address ADD to the address register 52, and transmits a command CMD to the command register 53. The output circuit transmits, to the controller 90, status information STS received from the status register 51, data DAT (read data RD) received from the data registers 60A and 60B, and the address ADD received from the address register 52. The I/O circuit 11 is coupled to the data registers 60A and 60B via a data bus.

The logic controller 50 receives, from the controller 90, for example, a signal /CE (an inversion signal of the signal CE), a signal CLE, a signal ALE, a signal /WE (an inversion signal of the signal WE), a signal /RE (an inversion signal of the signal RE), a signal DQS, and a signal /DQS. The logic controller 50 controls the I/O circuit 11 and the sequencer 54 in accordance with a received signal.

The status register 51 temporarily stores the status information STS. The status information STS is, for example, information indicative of whether or not a write operation, a read operation, and an erase operation have been properly completed. By reading the status information STS, the controller 90 can determine whether these operations have been properly completed.

The address register 52 temporarily stores the address ADD received from the controller 90 via the I/O circuit 11. The address register 52 transfers a row address RA to each of the row decoders 58A and 58B, and transfers a column address CA to each of the column decoders 61A and 61B.

The command register 53 temporarily stores the command CMD received from the controller 90 via the I/O circuit 11, and transfers it to the sequencer 54.

The sequencer 54 controls operations of the entire NAND flash memory 10. More specifically, the sequencer 54 controls, for example, the status register 51, the R/B circuit 55, the voltage generator 56, the row decoders 58A and 58B, the sense amplifiers 59A and 59B, the data registers 60A and 60B, and the column decoders 61A and 61B, in accordance with the command CMD stored in the command register 53, and performs a write operation, a read operation, an erase operation, etc.

The R/B circuit 55 transmits the signal RB to the controller 90 in accordance with an operation status of the sequencer 54.

Under the control of the sequencer 54, the voltage generator 56 generates voltages respectively required for the write, read, and erase operations, and supplies these generated voltages to, for example, each of the memory cell arrays 57A and 57B, the row decoders 58A and 58B, the sense amplifiers 59A and 59B, etc. The row decoders 58A and 58B and the sense amplifiers 59A and 59B respectively apply the voltages supplied from the voltage generator 56 to memory transistors in the memory cell arrays 57A and 57B.

Each of the memory cell arrays 57A and 57B includes a plurality of blocks BLK (BLK0 to BLKn, where n is a natural number equal to or greater than 1) each including nonvolatile memory cell transistors (also referred to as "memory cells" hereinafter) associated with rows and columns. The number of blocks BLK in the memory cell arrays 57A and 57B is designated to be any number. The memory cell arrays 57A and 57B will be described in detail later.

Each of the row decoders 58A and 58B decodes the row address RA. Based on a result of decoding, each of the row decoders 58A and 58B selects one of the blocks BLK, and also selects one of the plurality of string units included in each of the blocks BLK. The blocks BLK and the string units will be described in detail later. The row decoders 58A and 58B respectively apply necessary voltages to the blocks BLK.

In a read operation, the sense amplifiers 59A and 59B respectively sense data read from the memory cell arrays 57A and 57B. The sense amplifiers 59A and 59B respectively transmit the read data RD to the data registers 60A and 60B. In a write operation, the sense amplifiers 59A and 59B respectively transmit the write data WD to the memory cell arrays 57A and 57B.

Each of the data registers 60A and 60B includes a plurality of latch circuits. Each of the latch circuits can store the write data WD or the read data RD. For example, in a write operation, the data registers 60A and 60B temporarily store the write data WD received from the I/O circuit 11 and transmit it to the sense amplifiers 59A and 59B, respectively. For example, in a read operation, each of the data registers 60A and 60B temporarily stores the read data RD that they have respectively received from the sense amplifiers 59A and 59B, and then transmits the read data RD to the I/O circuit 11.

In a write operation, a read operation, an erase operation, etc., each of the column decoders 61A and 61B decodes the column address CA and based on a result of decoding, selects a latch circuit in the data registers 60A and 60B, respectively.

1.1.3 Circuit Configuration of Memory Cell Array 57

Figure 2:
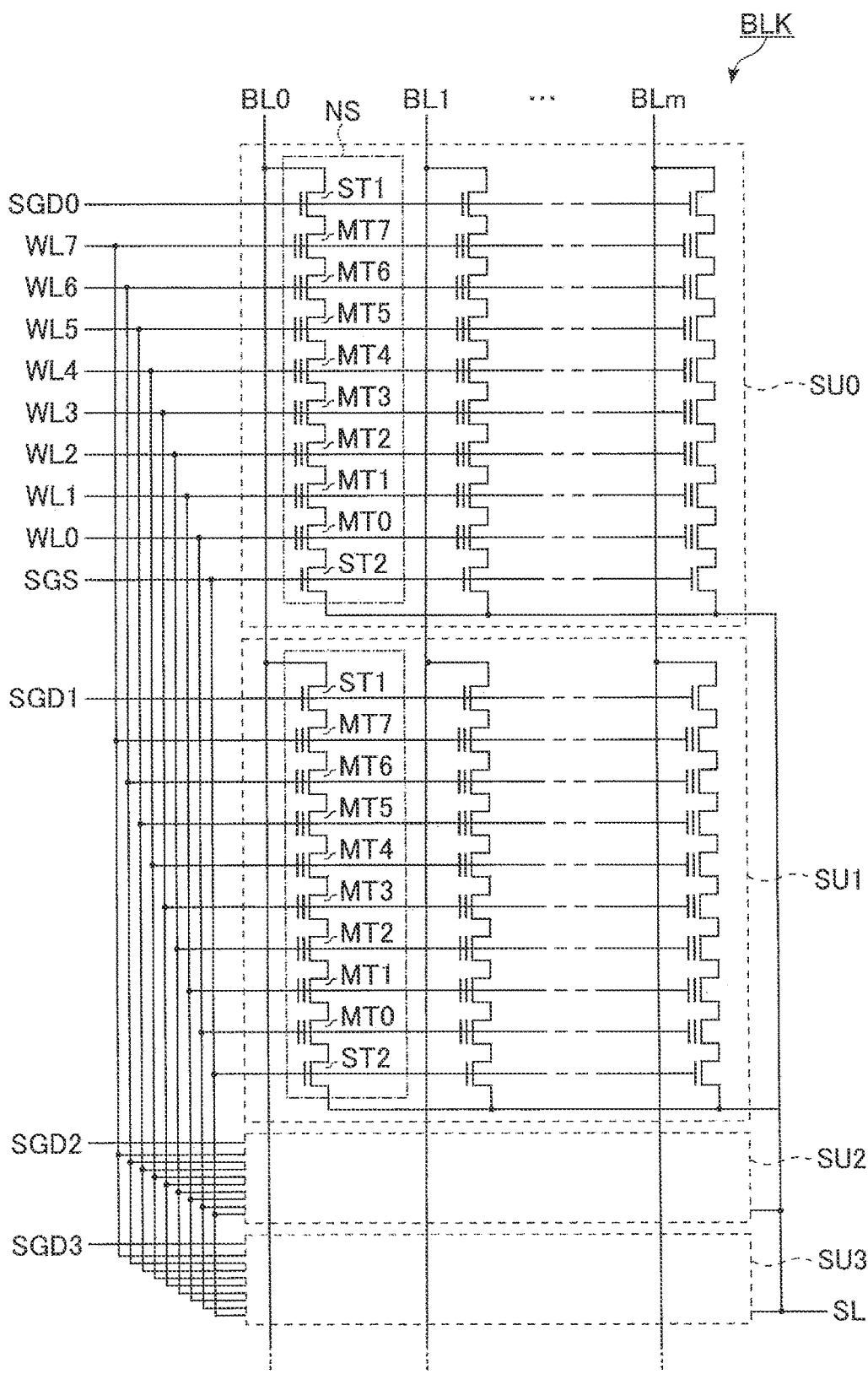
FIG. 2 is a circuit diagram of a memory cell array included in a semiconductor memory device according to the first embodiment.

Next, a circuit configuration of the memory cell array 57 will be described. As described above, the memory cell array 57 includes the plurality of blocks BLK (BLK0, BLK1, . . . , BLKn). FIG. 2 shows an exemplary circuit configuration of the memory cell array 57, by taking one of the blocks BLK included in the memory cell array 57.

As shown in FIG. 2, a block BLK includes, for example, four string units SU0 to SU3. The number of string units SU in the block BLK may be designed to be any number. Each of the string units SU includes a plurality of NAND strings NS. The plurality of NAND strings NS are respectively associated with bit lines BL0 to BLm (m is a natural number equal to or greater than 1). Each NAND string NS includes, for example, memory cell transistors MT0 to MT7 and select transistors ST1 and ST2. Each memory cell transistor MT includes a control gate and a charge storage layer, and stores data in a nonvolatile manner. Each of the select transistors ST1 and ST2 is used to select a string unit SU in various operations.

In each NAND string NS, memory cell transistors MT0 to MT7 are coupled in series between select transistors ST1 and ST2. The control gates of memory cell transistors MT0 to MT7 in the same block BLK are commonly coupled to word lines WL0 to WL7, respectively.

In each NAND string NS, a drain of the select transistor ST1 is coupled to an associated bit line BL, while a source of the select transistor ST1 is coupled to one end of the set of memory cell transistors MT0 to MT7, which are coupled in series. Gates of select transistors ST1 respectively included in the string units SU0 to SU3 in the same block BLK are respectively coupled in common to select gate lines SGD0 to SGD3.

In each NAND string NS, a drain of the select transistor ST2 is coupled to the other end of the set of memory cell transistors MT0 to MT7, which are coupled in series. In the same block BLK, sources of select transistors ST2 are coupled in common to a source line SL, and gates of select transistors ST2 are coupled in common to select a gate line SGS.

In the above-described circuit configuration of the memory cell array 57, the bit line BL is coupled in common between corresponding NAND strings NS in each block BLK, for example. The source line SL is coupled in common between the plurality of blocks BLK, for example.

Figure 3:
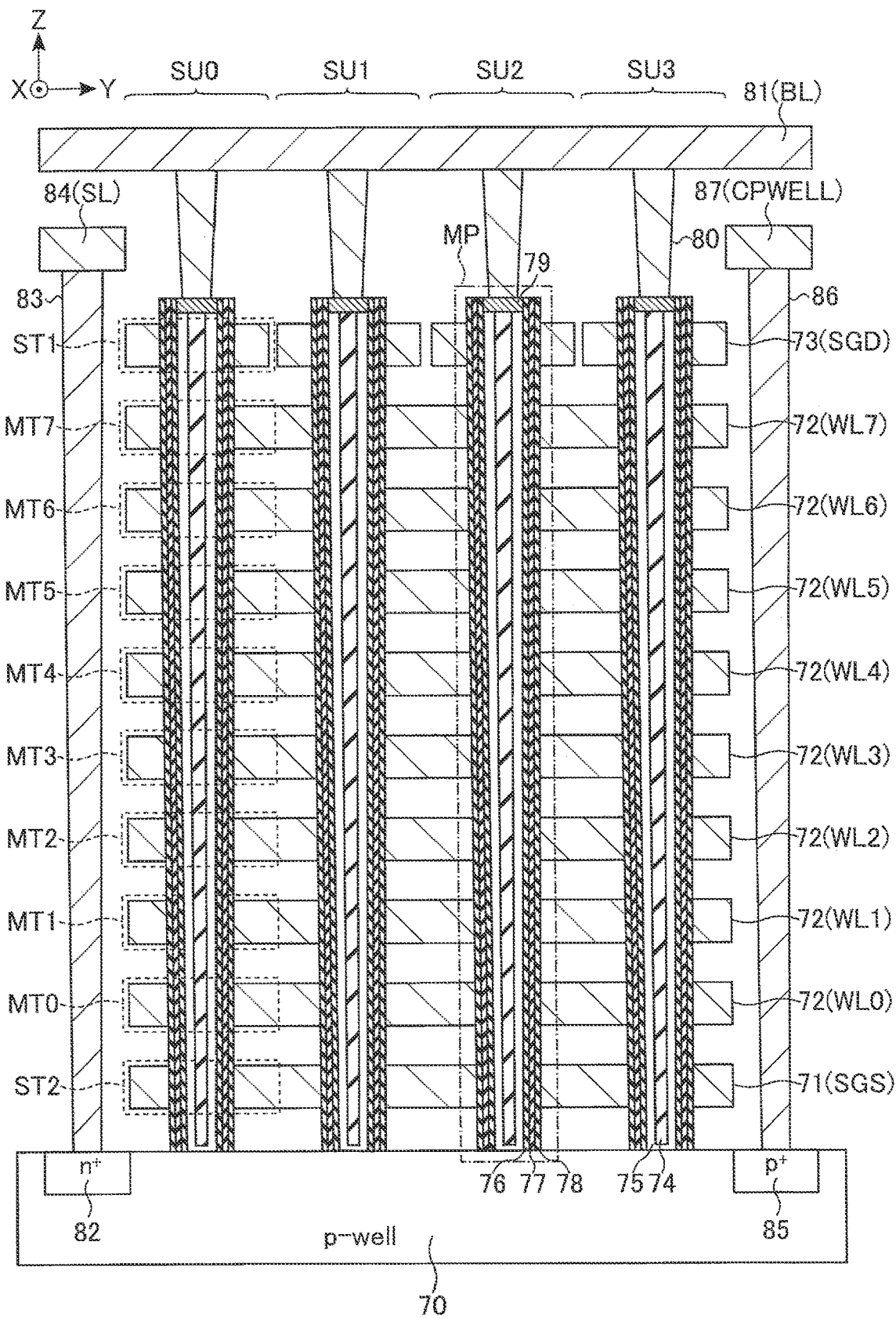
FIG. 3 is a cross-sectional view of the memory cell array included in the semiconductor memory device according to the first embodiment.

Next, a description will be given of a cross-sectional configuration of the memory cell array 57. FIG. 3 is a cross-sectional view of a partial region of a block BLK. In FIG. 3, the X direction corresponds to the extending direction of select gate lines, the Y direction that is orthogonal to the X direction within a horizontal plane corresponds to the extending direction of bit lines, and the Z direction is the stacking direction. In the example shown in FIG. 3, part of an insulating layer is omitted to simplify the description.

A p-type well region (p-well) 70 is provided in a semiconductor substrate. On the well region 70, an interconnect layer 71 that functions as a select gate line SGS, eight interconnect layers 72 that respectively function as word lines WL0 to WL7, and an interconnect layer 73 that functions as a select gate line SGD are sequentially stacked in such a manner as to be separated from each other (with unillustrated insulating layers each interposed between two adjacent layers).

Each memory pillar MP is formed into a columnar shape extending in the Z direction. Each memory pillar MP corresponds to a NAND string NS. Each memory pillar MP penetrates, for example, the interconnect layer 71, the eight interconnect layers 72, and the interconnect layer 73, and has a bottom surface reaching the p-type well region 70.

A memory pillar MP includes, for example, a core member 74, a semiconductor 75, insulating layers 76 to 78, and a conductor 79.

The core member 74 is formed in the center of the memory pillar MP and has a columnar shape extending in the Z direction.

The core member 74 has its side surface and lower surface covered with the semiconductor 75. The semiconductor 75 functions as a channel for each of the memory cell transistor MT and the select transistors ST1 and ST2.

The semiconductor 75 has its side surface covered with a stacked film including the insulating layers 76 to 78. The insulating layer 76 is in contact with the semiconductor 75 and surrounds the side surface of the semiconductor 75. The insulating layer 76 functions as a tunnel insulating film for the memory cell transistor MT.

The insulating film 77 is in contact with the insulating layer 76 and surrounds the side surface of the insulating layer 76. The insulating layer 77 functions as a charge storage layer for the memory cell transistor MT.

The insulating layer 78 is in contact with the insulating layer 77 and surrounds the side surface of the insulating layer 77. The insulating layer 78 functions as a block insulating film for the memory cell transistor MT.

The conductor 79 is formed on the top of the core member 74 and the semiconductor 75. The conductor 79 is electrically coupled to the semiconductor 75. The conductor 79 has its side surface covered with, for example, the stacked film including the insulating layers 76 to 78. The conductor 79 may be formed integrally with the semiconductor 75.

With the memory pillars MP thus configured, for example, a portion in which the memory pillar MP intersects the interconnect layer 71 functions as a select transistor ST2. Portions in which the memory pillar MP intersects the respective eight interconnect layers 72 function as memory cell transistors MT0 to MT7, respectively. A portion in which the memory pillar MP intersects the interconnect layer 73 functions as a select transistor ST1.

The memory pillar MP has its upper end coupled, via a contact plug 80, to a metal interconnect layer 81 that functions as a bit line BL.

The surface region of the well region 70 is provided with an $n^+$-type diffusion region 82 in which n-type impurities are introduced. A contact plug 83 is provided on the diffusion region 82, and is coupled to a metal interconnect layer 84 that functions as a source line SL. The surface region of the well region 70 is also provided with a $p^+$-type diffusion region 85 in which p-type impurities are introduced. A contact plug 86 is formed on the diffusion region 85, and is coupled to a metal interconnect layer 87 that functions as a well interconnect CPWELL. The well interconnect CPWELL is used to apply a voltage to the memory pillar MP via the well region 70.

A plurality of configurations described above are arranged in the depth direction (X direction) of the sheet of FIG. 3, and a group of NAND strings NS aligned in the X direction forms one string unit SU.

1.1.4 Configuration of I/O Circuit 11

Next, a circuit configuration of the I/O circuit 11 will be described with reference to FIG. 4. FIG. 4 is a circuit diagram showing the I/O circuit 11 according to the present embodiment, and focuses attention on data transmission and reception. In FIG. 4, the signal DQ is indicated by a solid line, while a control signal is indicated by a broken line. FIG. 4 omits arrows indicative of the following: transmission of the command CMD received from the controller 90 to the command register 53; transmission of the address ADD received from the controller 90 to the address register 52; and transmission of the address ADD received from the address register 52 to the controller 90.

As shown in FIG. 4, the I/O circuit 11 includes a DQ input/output selection circuit 12, a PL selection circuit 13, FIFO circuits 14A and 14B, and data input/output selection circuits 15A and 15B.

The DQ input/output selection circuit 12 receives, as control signals, a command CMD from the command register 53 and an address ADD from the address register 52. Based on the received command CMD and address ADD, the DQ input/output selection circuit 12 selects "input (IN)/output (OUT)" or "status (STATUS)".

In the case of selecting "IN/OUT", the DQ input/output selection circuit 12 electrically couples the controller 90 to the PL selection circuit 13. The DQ input/output selection circuit 12 either receives an input signal DQ (a command CMD, an address ADD, or data WD) from the controller 90 or receives an output signal DQ (data RD) from the PL selection circuit 13. In the case of receiving the command CMD as the input signal DQ, the DQ input/output selection circuit 12 transmits the received command CMD to the command register 53. In the case of receiving the address ADD as the input signal DQ, the DQ input/output selection circuit 12 transmits the received address ADD to the address register 52. In the case of receiving the data WD as the input signal DQ, the DQ input/output selection circuit 12 transmits the received data WD to the PL selection circuit 13. In the case of receiving the data RD from the PL selection circuit 13, the DQ input/output selection circuit 12 transmits the received data RD to the controller 90.

In the case of selecting "STATUS", the DQ input/output selection circuit 12 electrically couples the controller 90 to the status register 51. The DQ input/output selection circuit 12 receives status information STS from the status register 51, and transmits the received status information STS to the controller 90.

The PL selection circuit 13 receives, as control signals, the command CMD from the command register 53 and the address ADD from the address register 52. Based on the received command CMD and address ADD, the PL selection circuit 13 selects one of the combinations "plane PL0" and "IN", "plane PL0" and "OUT", "plane PL1" and "IN", and "plane PL1" and "OUT".

In the case of selecting "PL0" and "IN", the PL selection circuit 13 electrically couples the DQ input/output selection circuit 12 to the data input/output selection circuit 15A. The PL selection circuit 13 then receives data WD0 of the plane PL0 from the DQ input/output selection circuit 12, and transmits the received data WD0 to the data input/output selection circuit 15A.

In the case of selecting "PL0" and "OUT", the PL selection circuit 13 electrically couples the DQ input/output selection circuit 12 to the FIFO circuit 14A. The PL selection circuit 13 then receives data RD0 of the plane PL0 from the FIFO circuit 14A, and transmits the received data RD0 to the DQ input/output selection circuit 12.

In the case of selecting "PL1" and "IN", the PL selection circuit 13 electrically couples the DQ input/output selection circuit 12 to the data input/output selection circuit 15B. The PL selection circuit 13 then receives data WD1 of the plane PL1 from the DQ input/output selection circuit 12, and transmits the received data WD1 to the data input/output selection circuit 15B.

In the case of selecting "PL1" and "OUT", the PL selection circuit 13 electrically couples the DQ input/output selection circuit 12 to the FIFO circuit 14B. The PL selection circuit 13 then receives data RD1 of the plane PL1 from the FIFO circuit 14B, and transmits the received data RD1 to the DQ input/output selection circuit 12.

The FIFO circuit 14A fetches, based on a write clock Wclk to be described later, the data RD0 of the plane PL0 received from the data input/output selection circuit 15A. The FIFO circuit 14A further transmits a signal stored therein to the PL selection circuit 13 based on a read clock Rclk to be described later. The FIFO circuit 14A will be described later in detail.

The FIFO circuit 14B fetches, based on the write clock Wclk, the data RD1 of the plane PL1 received from the data input/output selection circuit 15B. The FIFO circuit 14B further transmits a signal stored therein to the PL selection circuit 13 based on the read clock Rclk. The FIFO circuit 14B is the same as the FIFO circuit 14A. The FIFO circuit 14B may differ from the FIFO circuit 14A. The FIFO circuit 14B will be described later in detail.

The data input/output selection circuit 15A receives, as control signals, the command CMD from the command register 53 and the address ADD from the address register 52. Based on the received command CMD and address ADD, the data input/output selection circuit 15A selects "IN" or "OUT".

In the case of selecting "IN", the data input/output selection circuit 15A electrically couples the data register 60A to the PL selection circuit 13. The data input/output selection circuit 15A receives the data WD0 of the plane PL0 from the PL selection circuit 13, and transmits the received data WD0 to the data register 60A.

In the case of selecting "OUT", the data input/output selection circuit 15A electrically couples the data register 60A to the FIFO circuit 14A. The data input/output selection circuit 15A receives the data RD0 of the plane PL0 from the data register 60A, and transmits the received data RD0 to the FIFO circuit 14A.

The data input/output selection circuit 15B receives, as control signals, the command CMD from the command register 53, and the address ADD from the address register 52. Based on the received command CMD and address ADD, the data input/output selection circuit 15B selects "IN" or "OUT".

In the case of selecting "IN", the data input/output selection circuit 15B electrically couples the data register 60B to the PL selection circuit 13. The data input/output selection circuit 15B receives the data WD1 of the plane PL1 from the PL selection circuit 13, and transmits the received data WD1 to the data register 60B.

In the case of selecting "OUT", the data input/output selection circuit 15B electrically couples the data register 60B to the FIFO circuit 14B. The data input/output selection circuit 15B receives the data RD1 of the plane PL1 from the data register 60B, and transmits the received data RD1 to the FIFO circuit 14B. The data input/output selection circuit 15B is the same as the data input/output selection circuit 15A. The data input/output selection circuit 15B may differ from the data input/output selection circuit 15A.

1.1.5 Configuration of FIFO Circuit 14

Figure 5:
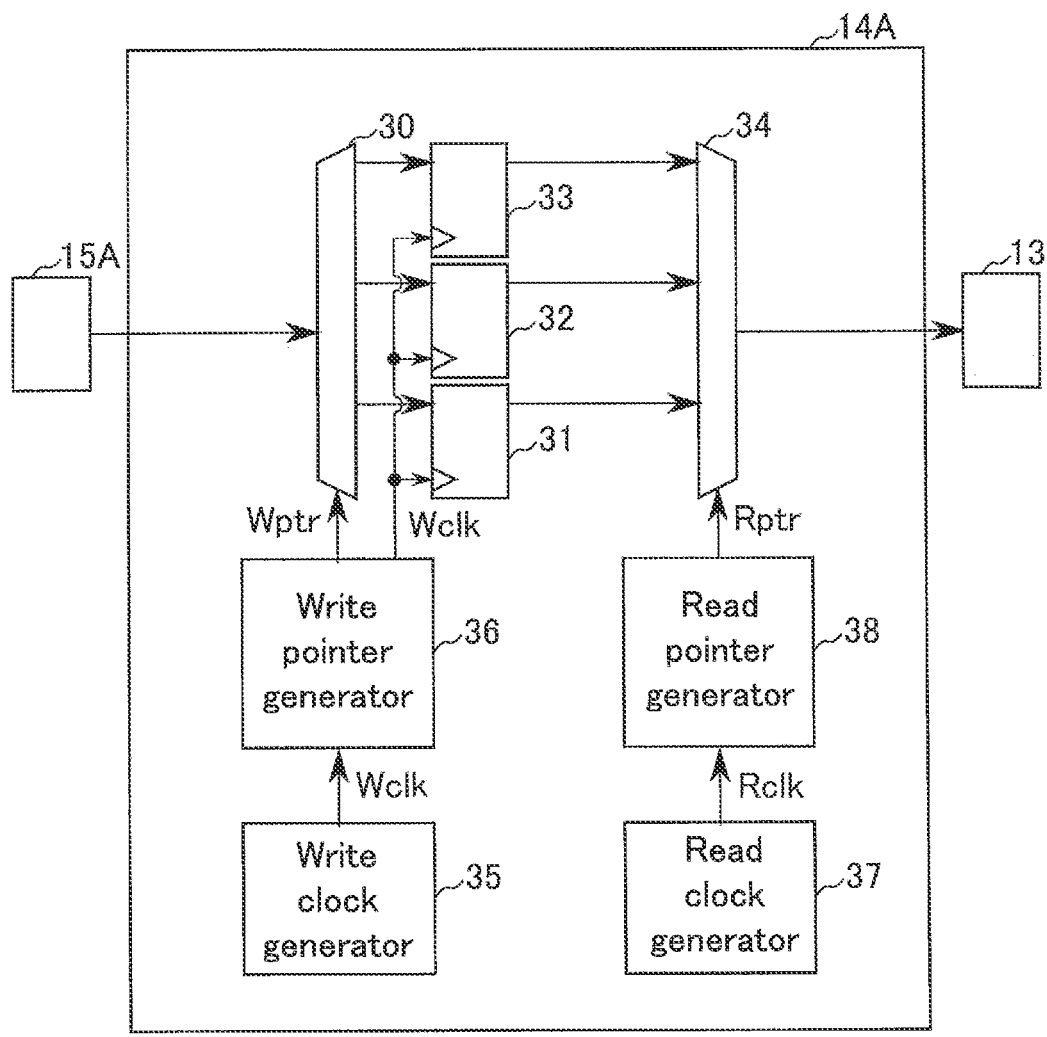
FIG. 5 is a circuit diagram showing an example of a first in, first out (FIFO) circuit included in the I/O circuit shown in FIG. 4.

Next, a circuit configuration of the FIFO circuit 14 will be described with reference to FIG. 5. FIG. 5 is a circuit diagram showing an example of the FIFO circuit 14A according to the present embodiment.

As shown in FIG. 5, the FIFO circuit 14A includes a multiplexer (hereinafter, referred to as a "MUX") 30, flip flops (hereinafter, referred to as an "FF") 31 to 33, a MUX 34, a write clock generator 35, a write pointer generator 36, a read clock generator 37, and a read pointer generator 38.

The MUX 30 selects one of the FF 31 to FF 33 based on a write pointer Wptr received from the write pointer generator 36. The MUX 30 transmits, to the selected FF, a signal received from the data input/output selection circuit 15A. The write pointer Wptr will be described later in detail.

The FF 31 to FF 33 each receive a signal from the MUX 30. The FFs 31 to 33 each fetch the signal received from the MUX 30 at the time when a write clock Wclk rises from level "L" to level "H", and stores the fetched signal. Furthermore, each of the FF 31 to FF 33 outputs a signal stored therein to the MUX 34 at the time when the write clock Wclk rises from the "L" level to the "H" level.

The MUX 34 selects one of the FF 31 to FF 33 based on a read pointer Rptr received from the read pointer generator 38. The MUX 34 transmits a signal received from the selected FF to the PL selection circuit 13 at the time when the read pointer Rptr is incremented. The read pointer Rptr will be described later in detail.

The write clock generator 35 generates the write clock Wclk that determines a timing for fetching signals into the FF 31 to FF 33.

The write pointer generator 36 generates the write pointer Wptr that determines which of the FF 31 to FF 33 fetches a signal received from the data input/output selection circuit 15A. The write pointer Wptr is incremented at the time when the write clock Wclk rises from the "L" level to the "H" level, and designates one of the FF 31 to FF 33.

The read clock generator 37 generates the read clock Rclk that determines a timing for outputting a signal from the MUX 34.

The read pointer generator 38 generates the read pointer Rptr that determines which of the FF 31 to FF 33 to output the received signal from. The read pointer Rptr is incremented at the time when the read clock Rclk rises from the "L" level to the "H" level, and designates one of the FF 31 to FF 33.

The FF 31 to FF 33 may be formed in a multistage manner between the MUX 30 and the MUX 34.

1.2 Operation of NAND Flash Memory 10

Figure 7:
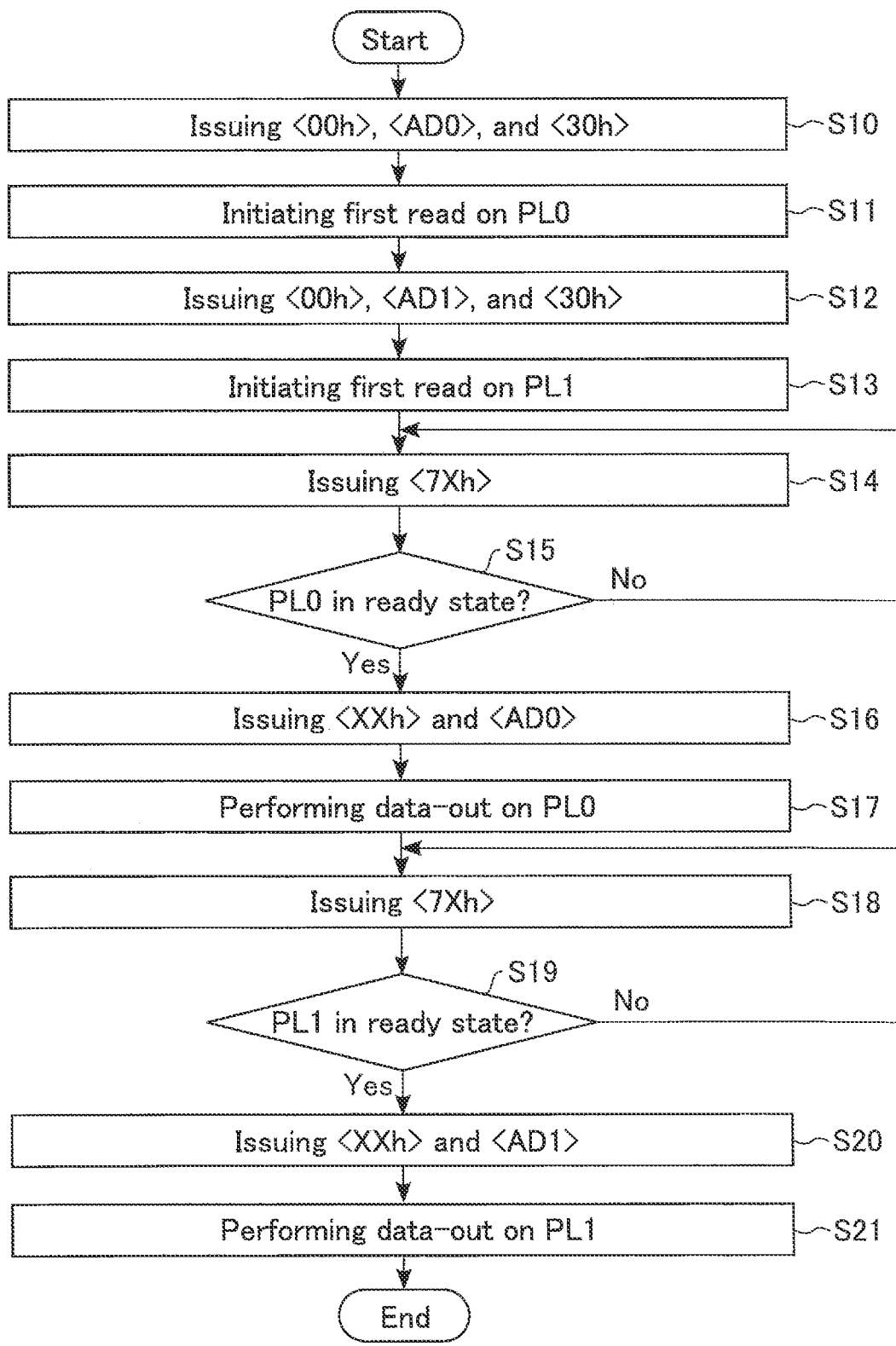
FIG. 7 is a flowchart showing the read operation of the semiconductor memory device according to the first embodiment.

Next, operations of the NAND flash memory 10 will be described with reference to FIG. 6 and FIG. 7. FIG. 6 is a timing chart of a command sequence and various signals in the case of reading data from the plane PL0 and the plane PL1 of the NAND flash memory 10. FIG. 7 is a flowchart in the case of reading data from the plane PL0 and the plane PL1.

As shown in FIG. 6, at time t1, the controller 90 issues, for example, a command <00h>, an address <AD0> of the plane PL0, and a command <30h> (step S10 in FIG. 7). The I/O circuit 11 receives the command <00h>, the address <AD0> of the plane PL0, and the command <30h> each issued by the controller 90. The command "00h" is a command for ordering, for example, the NAND flash memory 10 to perform a read operation on data from the memory cell array 57. The address "AD0" designates, for example, an address of a chip, an address of the plane PL0, an address of a region within the plane PL0, etc. The command "30h" is a command for causing, for example, the NAND flash memory 10 to perform a read operation on data from the memory cell array 57 based on the address "AD0" transmitted immediately before the command.

At time t1, a cache busy signal CB0 of the plane PL0 is in a ready state, a cache busy signal CB1 of the plane PL1 is in a ready state, and the signal RB is in a ready state. The signal CB0 is a signal indicating whether the plane PL0 is in a busy state or in a ready state. For example, the signal CB0 is set to the "L" level when the plane PL0 is in the busy state. The signal CB1 is a signal indicating whether the plane PL1 is in a busy state or in a ready state. For example, signal CB1 is set to the "L" level when the plane PL1 is in the busy state. The signal RB corresponds to a result of an OR operation performed by the sequencer 54 on the signal CB0 and the signal CB1. The signals CB0, CB1, and RB are stored in the status register 51.

At time t2, upon receipt of the command "30h" from the command register 53, the sequencer 54 initiates the first read in the plane PL0 (step S11 in FIG. 7). More specifically, the sense amplifier 59A reads data RD0 from the memory cell array 57A, and transmits the read data RD0 to the data register 60A. Upon initiating the first read, the sequencer 54 sets the signal CB0 to a busy state. The sequencer 54 further performs an OR operation on the signal CB0 at the "L" level and the signal CB1 at the "H" level, and based on a result of the operation, sets the signal RB to a busy state. Throughout this description, the "first read" indicates an operation in which the sense amplifier 59 reads the data RD from the memory cell array 57, transmits the read data RD to the data register 60, and then prefetches the read data RD. "Prefetching" indicates an operation in which the read data RD is taken from the data register 60 and is accumulated in the FIFO circuit 14.

At time t3, the controller 90 issues, for example, the command <00h>, an address <AD1> of the plane PL1, and the command <30h> (step S12 in FIG. 7). The I/O circuit 11 receives the command <00h>, the address <AD1> of the plane PL1, and the command <30h>, each issued by the controller 90. The address <AD1> designates, for example, an address of a chip, an address of the plane PL1, an address of a region within the plane PL1, etc.

At time t4, upon receipt of the command "30h" from the command register 53, the sequencer 54 initiates the first read in the plane PL1 (step S13 in FIG. 7). More specifically, the sense amplifier 59B reads the data RD1 from the memory cell array 57B, and transmits the read data RD1 to the data register 60B. Upon initiating the first read, the sequencer 54 sets the signal CB1 to a busy state. The sequencer 54 further performs an OR operation on the signal CB0 at the "L" level and the signal CB1 at the "L" level, and based on a result of the operation, sets the signal RB to a busy state.

At time t5, in the plane PL0, when reading from the memory cell array 57A is completed, the I/O circuit 11 performs prefetching on the plane PL0 (step S11 in FIG. 7). More specifically, the data input/output selection circuit 15A selects "OUT" based on the command CMD and the address ADD. The data input/output selection circuit 15A receives the data RD0 from the data register 60A, and transmits the received data RD0 to the FIFO circuit 14A. The FIFO circuit 14A receives the data RD0 from the data input/output selection circuit 15A, and fetches the received data RD0 based on the write clock Wclk.

At time t6, when prefetching on the plane PL0 is completed, the sequencer 54 sets the signal CB0 to a ready state. The sequencer 54 further performs an OR operation on the signal CB0 at the "H" level and the signal CB1 at the "L" level, and based on a result of the operation, sets the signal RB to a busy state.

During a period from time t4 to time t6, the controller 90 issues a command <7Xh> (step S14 in FIG. 7). The I/O circuit 11 receives the command <7Xh> issued by the controller 90. The command <7Xh> is a command for, e.g., reading status information STS from the status register 51.

During the period from time t4 to time t6, upon receipt of the command <7Xh> from the command register 53, the sequencer 54 transmits the signals CB0, CB1, and RB from the status register 51 to the controller 90. If the signal CB0 received by the controller 90 exhibits a ready state (Yes in step S15 in FIG. 7), the controller 90 issues a command <XXh> and the address <AD0> of the plane PL0 (step S16 in FIG. 7). The I/O circuit 11 receives the command <XXh> and the address <AD0> of the plane PL0, each issued by the controller 90. The command "XXh" is a command for, for example, ordering data-out by simultaneously selecting a chip and a plane PL. In this case, the address "AD0" designates, for example, an address of a chip and an address of the plane PL0. On the other hand, if the signal CB0 received by the controller 90 exhibits a busy state (No in step S15 in FIG. 7), the controller 90 performs step S14 described above. That is, during the period from time t4 to time t6, the controller 90 issues the command <7Xh> multiple times, and issues the command <XXh> and the address <AD0> of the plane PL0 at the time when the signal CB0 goes into a ready state. Prefetching on the plane PL0 by the I/O circuit 11 and issuing of the command <7Xh> by the controller 90 are performed in parallel.

At time t6, the controller 90 issues the command <7Xh>. At time t7, the signal CB0 is in a ready state, so that the controller 90 issues the command <XXh> and the address <AD0> of the plane PL0.

At time t8, when the address "AD0" that designates the plane PL0 is stored in the address register 52, the I/O circuit 11 outputs the data RD0 of the plane PL0 from the FIFO circuit 14A to the controller 90 (step S17 in FIG. 7). More specifically, the FIFO circuit 14A transmits the data RD0 to the PL selection circuit 13 based on the read clock Rclk. The PL selection circuit 13 selects "PL0" and "OUT" based on the command CMD and the address ADD. The PL selection circuit 13 then receives the data RD0 from the FIFO circuit 14A, and transmits the received data RD0 to the DQ input/output selection circuit 12. The DQ input/output selection circuit 12 selects "IN/OUT" based on the command CMD and the address ADD. The DQ input/output selection circuit 12 receives the data RD0 from the PL selection circuit 13, transmits the received data RD0 to the controller 90.

At time t9, in the plane PL1, when reading from the memory cell array 57B is completed, the I/O circuit 11 performs prefetching on the plane PL1 (step S13 in FIG. 7). More specifically, the data input/output selection circuit 15B selects "OUT" based on the command CMD and the address ADD. The data input/output selection circuit 15B receives the data RD1 from the data register 60B, and transmits the received data RD1 to the FIFO circuit 14B. The FIFO circuit 14B receives the data RD1 from the data input/output selection circuit 15B, and fetches the received data RD1 based on the write clock Wclk.

At time t10, when prefetching on the plane PL1 is completed, the sequencer 54 sets the signal CB1 to a ready state. The sequencer 54 further performs an OR operation on the signal CB0 at the "H" level and the signal CB1 at the "H" level, and based on a result of the operation, sets the signal RB to a ready state.

During a period from time t8 to time t12, the controller 90 issues the command <7Xh> (step S18 in FIG. 7). The I/O circuit 11 receives the command <7Xh> issued by the controller 90.

During the period from time t8 to time t12, upon receipt of the command <7Xh> from the command register 53, the sequencer 54 transmits the signals CB0, CB1, and RB from the status register 51 to the controller 90. If the signal CB1 received by the controller 90 exhibits a ready state (Yes in step S19 in FIG. 7), the controller 90 issues the command <XXh> and the address <AD1> of the plane PL1 (step S20 in FIG. 7). The I/O circuit 11 receives the command <XXh> and the address <AD1> of the plane PL1 each issued by the controller 90. On the other hand, if the signal CB1 received by the controller 90 exhibits a busy state (No in step S19 in FIG. 7), the controller 90 performs step S18 described above.

At time t12, the controller 90 issues the command <7Xh>. At time t13, the signal CB1 is in a ready state, so that the controller 90 issues the command <XXh> and the address <AD1> of the plane PL1.

At time t14, when the address "AD1" that designates the plane PL1 is stored in the address register 52, the I/O circuit 11 outputs the data RD1 of the plane PL1 from the FIFO circuit 14B to the controller 90 (step S21 in FIG. 7). More specifically, the FIFO circuit 14B transmits the data RD1 to the PL selection circuit 13 based on the read clock Rclk. The PL selection circuit 13 selects "PL1" and "OUT" based on the command CMD and the address ADD. The PL selection circuit 13 then receives the data RD1 from the FIFO circuit 14B, and transmits the received data RD1 to the DQ input/output selection circuit 12. The DQ input/output selection circuit 12 selects "IN/OUT" based on the command CMD and the address ADD. The DQ input/output selection circuit 12 receives the data RD1 from the PL selection circuit 13, and transmits the received data RD1 to the controller 90.

At time t15, data-out performed on the plane PL1 is completed.

1.3 Advantageous Effect of Present Embodiment

Figure 8:
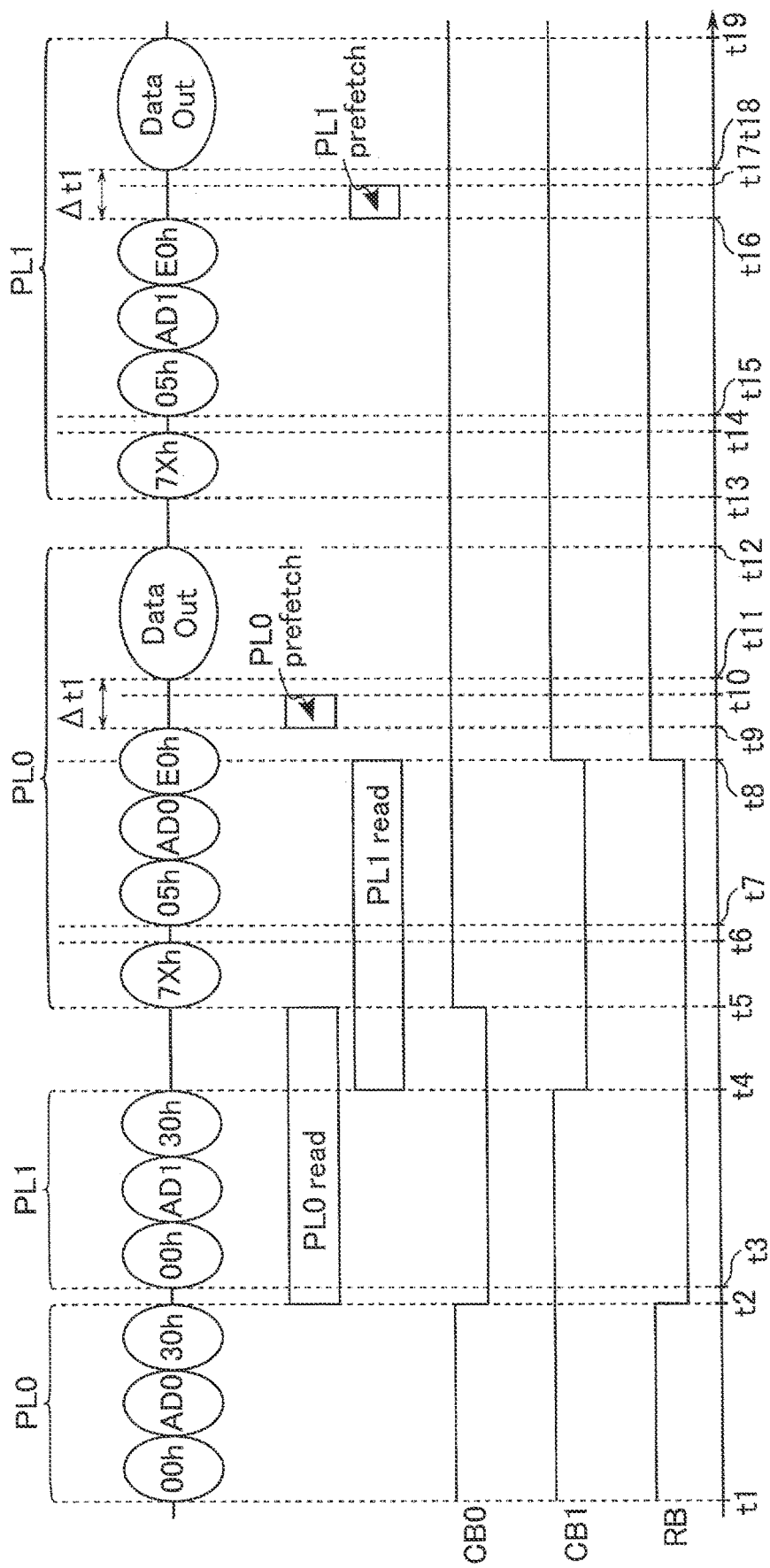
FIG. 8 is a diagram illustrating a preparation period for data-out of read data.

The configuration according to the present embodiment can enhance the speed of operations of the semiconductor memory device. This advantageous effect will be described below. FIG. 8 shows, as a comparative example, an exemplary timing chart of a command sequence and various signals in the case of reading data from the plane PL0 and the plane PL1 in a semiconductor memory device including a single FIFO circuit 14 in the I/O circuit 11.

As shown in FIG. 8, at time t1, the controller 90 issues, for example, the command <00h>, the address <AD0> of the plane PL0, and the command <30h>. The I/O circuit 11 receives the command <00h>, the address <AD0> of the plane PL0, and the command <30h> each issued by the controller 90. At time t1, the signal CB0 is in a ready state, the signal CB1 is in a ready state, and the signal RB is in a ready state.

At time t2, upon receipt of the command "30h" from the command register 53, the sequencer 54 initiates the second read in the plane PL0. More specifically, the sense amplifier 59A reads data RD0 from the memory cell array 57A, and transmits the read data RD0 to the data register 60A. Upon initiating the second read, the sequencer 54 sets the signal CB0 to a busy state. The sequencer 54 further performs an OR operation on the signal CB0 at the "L" level and the signal CB1 at the "H" level, and based on a result of the operation, sets the signal RB to a busy state. Throughout this description, the "second read" indicates an operation in which the sense amplifier 59 reads the data RD from the memory cell array 57, and transmits the read data RD to the data register 60.

At time t3, the controller 90 issues, for example, the command <00h>, the address <AD1> of the plane PL1, and the command <30h>. The I/O circuit 11 receives the command <00h>, the address <AD1> of the plane PL1, and the command <30h> each issued by the controller 90.

At time t4, upon receipt of the command "30h" from the command register 53, the sequencer 54 initiates the second read in the plane PL1. More specifically, the sense amplifier 59B reads data RD1 from the memory cell array 57B, and transmits the read data RD1 to the data register 60B. Upon initiating the second read, the sequencer 54 sets the signal CB1 to a busy state. The sequencer 54 further performs an OR operation on the signal CB0 at the "L" level and the signal CB1 at the "L" level, and based on a result of the operation, sets the signal RB to a busy state.

At time t5, when the second read is completed in the plane PL0, the sequencer 54 sets the signal CB0 to a ready state. The sequencer 54 further performs an OR operation on the signal CB0 at the "H" level and the signal CB1 at the "L" level, and based on a result of the operation, sets the signal RB to a busy state.

During a period from time t4 to time t5, the controller 90 issues the command <7Xh>. The I/O circuit 11 receives the command <7Xh> issued by the controller 90.

During the period from time t4 to time t5, upon receipt of the command <7Xh> from the command register 53, the sequencer 54 transmits the signals CB0, CB1, and RB from the status register 51 to the controller 90.

During the period from time t4 to time t5, if the signal CB0 received from the NAND flash memory 10 is in a ready state, the controller 90 issues a command <05h>, the address <AD0> of the plane PL0, and a command <E0h>. The I/O circuit 11 receives the command <05h>, the address <AD0> of the plane PL0, and the command <E0h> each issued by the controller 90. The command "05h" is a command for ordering, for example, the NAND flash memory 10 to perform a read operation on reading data from the NAND flash memory 10. The address "AD0" in this case designates, for example, an address of a chip, an address of the plane PL0, an address of a region within the plane PL0, etc. The command "E0h" is a command for causing, for example, the NAND flash memory 10 to perform a read operation on data from the NAND flash memory 10 based on the address <AD0> transmitted immediately before the command.

At time t5, the controller 90 issues the command <7Xh>. At time t7, the signal CB0 is in a ready state, so that the controller 90 issues the command <05h>, the address <AD0> of the plane PL0, and the command <E0h>.

At time t8, when the second read in the plane PL1 is completed, the sequencer 54 sets the signal CB1 to a ready state. The sequencer 54 further performs an OR operation on the signal CB0 at the "H" level and the signal CB1 at the "H" level, and based on a result of the operation, sets the signal RB to a ready state.

At time t9, upon receipt of the command "E0h" from the command register 53, the sequencer 54 causes the I/O circuit 11 to perform prefetching on the plane PL0. More specifically, the data RD0 of the plane PL0 is taken from the data register 60A and is fetched into the FIFO circuit 14.

When prefetching on the plane PL0 is completed at time t10, at time t11, the I/O circuit 11 outputs the data RD0 of the plane PL0 from the FIFO circuit 14 to the controller 90.

At time t12, data-out on the plane PL0 is completed. Subsequently, as with the plane PL0, the commands <7Xh> and <05h>, the address <AD1>, and the command <E0h> are issued for the plane PL1, and after execution of the prefetching on the plane PL1, the data RD1 of the plane PL1 is output from the FIFO circuit 14 to the controller 90.

In this case, with respect to the data RD read to the data register 60, preparation for data-out to the controller 90 is performed during a period from time t9 to time t11 (hereinafter, referred to as "preparation period Δt1"). Specifically, the preparation period Δt1 occurs from when the sequencer 54 receives the command "E0h" from the command register 53 to when data-out is initiated.

On the other hand, in the present embodiment, the two FIFO circuits 14A and 14B are contained in the I/O circuit 11. This configuration enables continuous execution of prefetching after reading of the data RD0 from the memory cell array 57A to the data register 60A. This configuration also enables continuous execution of prefetching after reading of the data RD1 from the memory cell array 57B to the data register 60B. Accordingly, the NAND flash memory 10 can realize a relatively short preparation period from receipt of the command <XXh> and the address <AD0> of the plane PL0 to initiation of data-out of the data RD0. Similarly, the NAND flash memory 10 can realize a relatively short preparation period from receipt of the command <XXh> and address <AD1> of the plane PL1 to initiation of data-out of the data RD1. This can enhance the speed of operations of the semiconductor memory device.

1.4 Modification

Next, a semiconductor memory device according to a modification of the first embodiment will be described. The semiconductor memory device according to the present modification is configured by reducing the number of the FIFO circuits 14 within the I/O circuit 11 according to the first embodiment to one, and is configured in such a manner as to continuously perform prefetching after data RD0 is read from the memory cell array 57A to the data register 60A. The following description will focus only on the points that differ from the first embodiment.

1.4.1 Configuration of I/O Circuit 11

Figure 9:
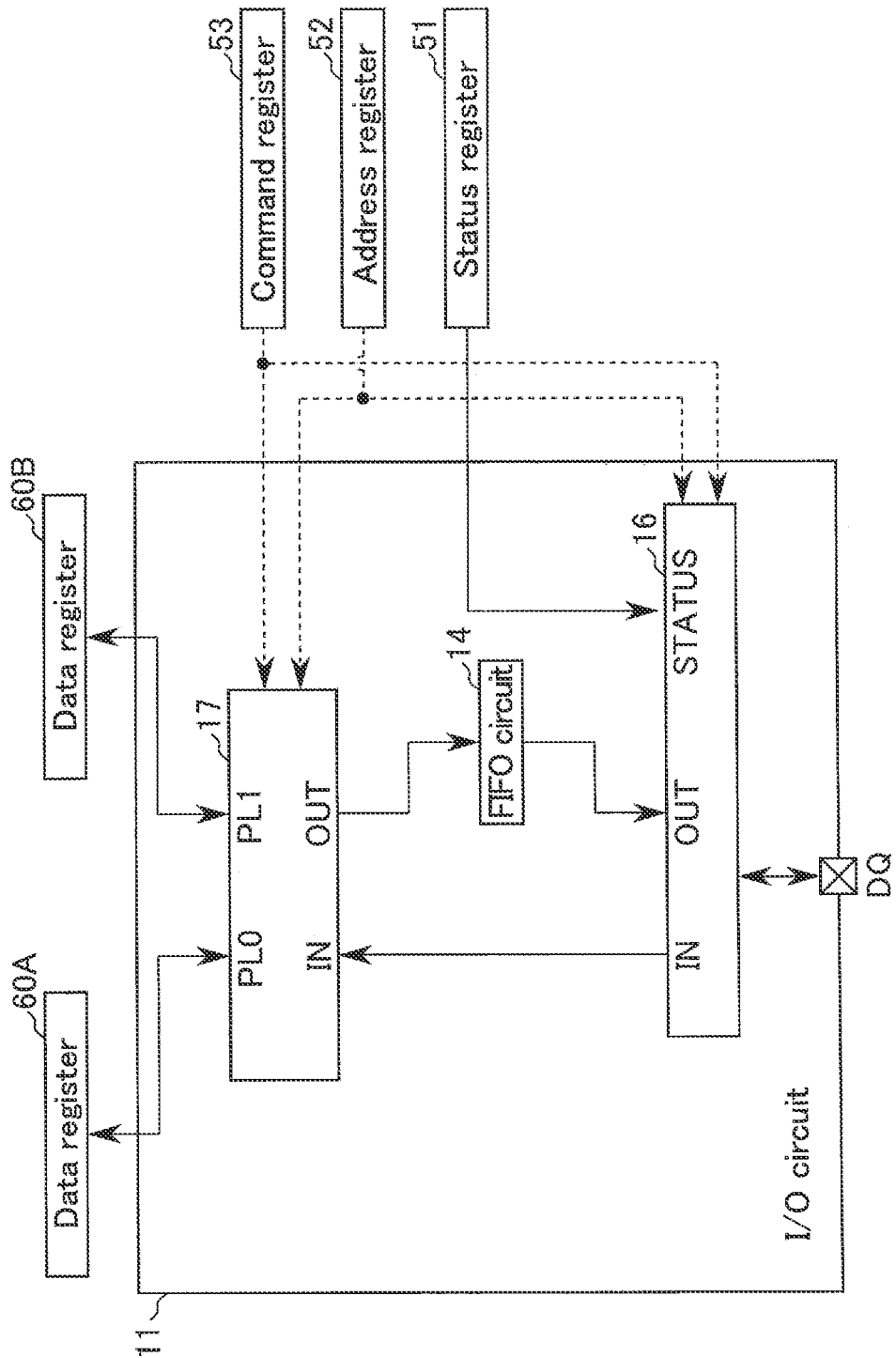
FIG. 9 is a circuit diagram showing an I/O circuit included in a semiconductor memory device according to a modification of the first embodiment.

Next, a circuit configuration of the I/O circuit 11 will be described with reference to FIG. 9. FIG. 9 is a circuit diagram showing the I/O circuit 11 according to the present modification. In FIG. 9, the signal DQ is indicated by a solid line, while a control signal is indicated by a broken line. FIG. 9 omits arrows indicative of the following: transmission of the command CMD received from the controller 90 to the command register 53; transmission of the address ADD received from the controller 90 to the address register 52; and transmission of the address ADD received from the address register 52 to the controller 90.

As shown in FIG. 9, the I/O circuit 11 includes the FIFO circuit 14, a DQ input/output selection circuit 16, and a data input/output selection circuit 17.

The DQ input/output selection circuit 16 receives, as control signals, a command CMD from the command register 53, and an address ADD from the address register 52. Based on the received command CMD and address ADD, the DQ input/output selection circuit 16 selects one of "IN", "OUT", and "STATUS".

In the case of selecting "IN", the DQ input/output selection circuit 16 electrically couples the controller 90 to the command register 53, the address register 52, or the data input/output selection circuit 17. The DQ input/output selection circuit 16 receives an input signal DQ (a command CMD, an address ADD, or data WD) from the controller 90. In the case of receiving the command CMD as the input signal DQ, the DQ input/output selection circuit 16 transmits the received command CMD to the command register 53. In the case of receiving the address ADD as the input signal DQ, the DQ input/output selection circuit 16 transmits the received address ADD to the address register 52. In the case of receiving the data WD as the input signal DQ, the DQ input/output selection circuit 16 transmits the received data WD to the data input/output selection circuit 17.

In the case of selecting "OUT", the DQ input/output selection circuit 16 electrically couples the controller 90 to the FIFO circuit 14. The DQ input/output selection circuit 16 receives an output signal DQ (data RD) from the FIFO circuit 14, and transmits the received signal to the controller 90.

In the case of selecting "STATUS", the DQ input/output selection circuit 16 electrically couples the controller 90 to the status register 51. The DQ input/output selection circuit 16 receives status information STS from the status register 51, and transmits the received status information STS to the controller 90.

The FIFO circuit 14 receives data RD0 of the plane PL0 or data RD1 of the plane PL1 from the data input/output selection circuit 17, and fetches the received data RD0 or data RD1 based on a write clock Wclk. The FIFO circuit 14 transmits a signal stored therein to the DQ input/output selection circuit 16 based on a read clock Rclk. The FIFO circuit 14 is the same as the FIFO circuit 14A shown in FIG. 5.

The data input/output selection circuit 17 receives, as control signals, the command CMD from the command register 53 and the address ADD from the address register 52. Based on the received command CMD and address ADD, the data input/output selection circuit 17 selects one of the combinations "PL0" and "IN", "PL0" and "OUT", "PL1" and "IN", and "PL1" and "OUT".

In the case of selecting "PL0" and "IN", the data input/output selection circuit 17 electrically couples the data register 60A to the DQ input/output selection circuit 16. The data input/output selection circuit 17 receives data WD0 of the plane PL0 from the DQ input/output selection circuit 16, and transmits the received data WD0 to the data register 60A.

In the case of selecting "PL0" and "OUT", the data input/output selection circuit 17 electrically couples the data register 60A to the FIFO circuit 14. The data input/output selection circuit 17 receives the data RD0 of the plane PL0 from the data register 60A, and transmits the received data RD0 to the FIFO circuit 14.

In the case of selecting "PL1" and "IN", the data input/output selection circuit 17 electrically couples the data register 60B to the DQ input/output selection circuit 16. The data input/output selection circuit 17 receives data WD1 of the plane PL1 from the DQ input/output selection circuit 16, and transmits the received data WD1 to the data register 60B.

In the case of selecting "PL1" and "OUT", the data input/output selection circuit 17 electrically couples the data register 60B to the FIFO circuit 14. The data input/output selection circuit 17 receives the data RD1 of the plane PL1 from the data register 60B, and transmits the received data RD1 to the FIFO circuit 14.

1.4.2 Operation of NAND Flash Memory 10

Figure 10:
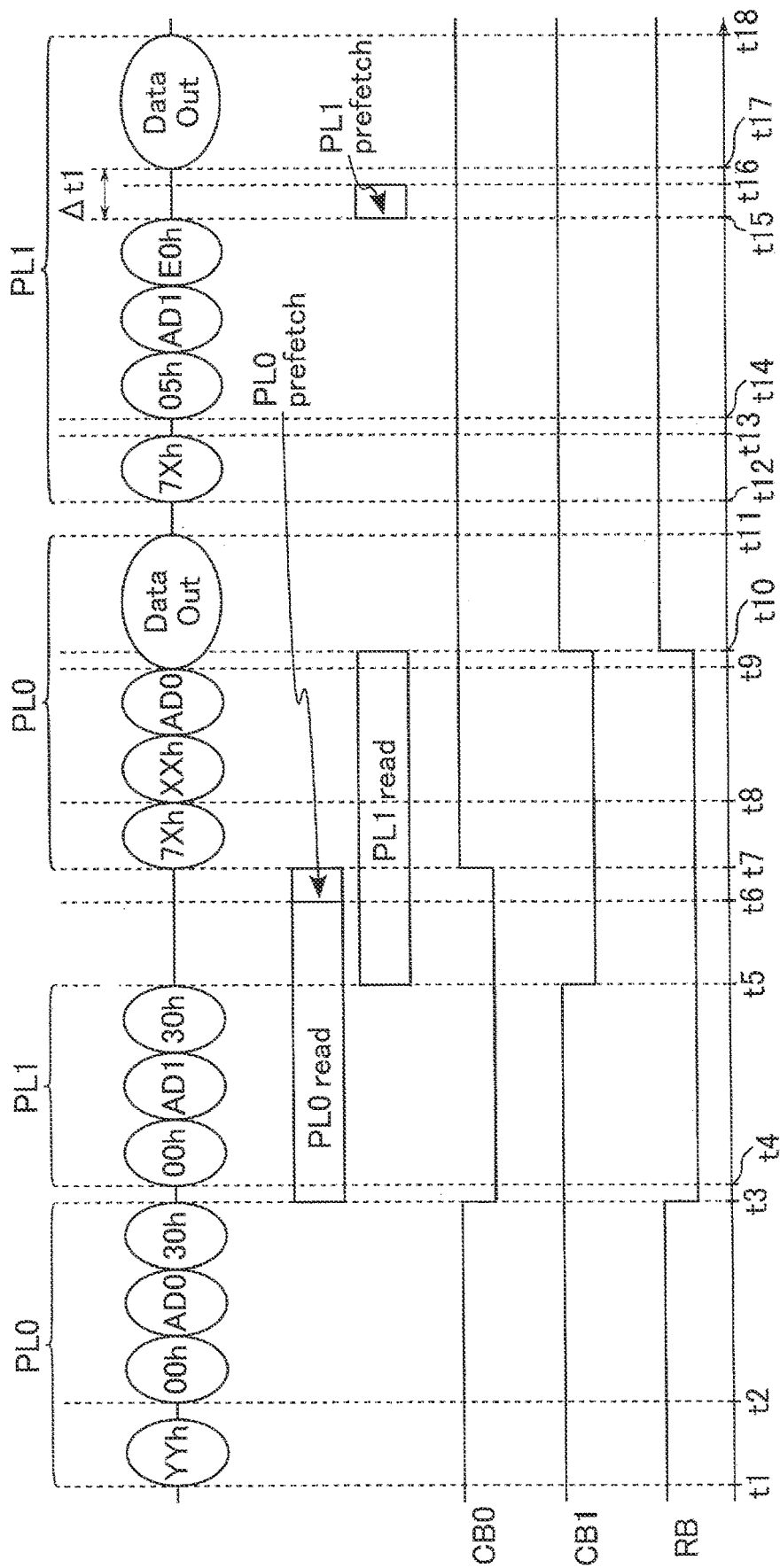
FIG. 10 is a timing chart of a command sequence and various signals during a read operation of the semiconductor memory device according to the modification of the first embodiment.
Figure 11:
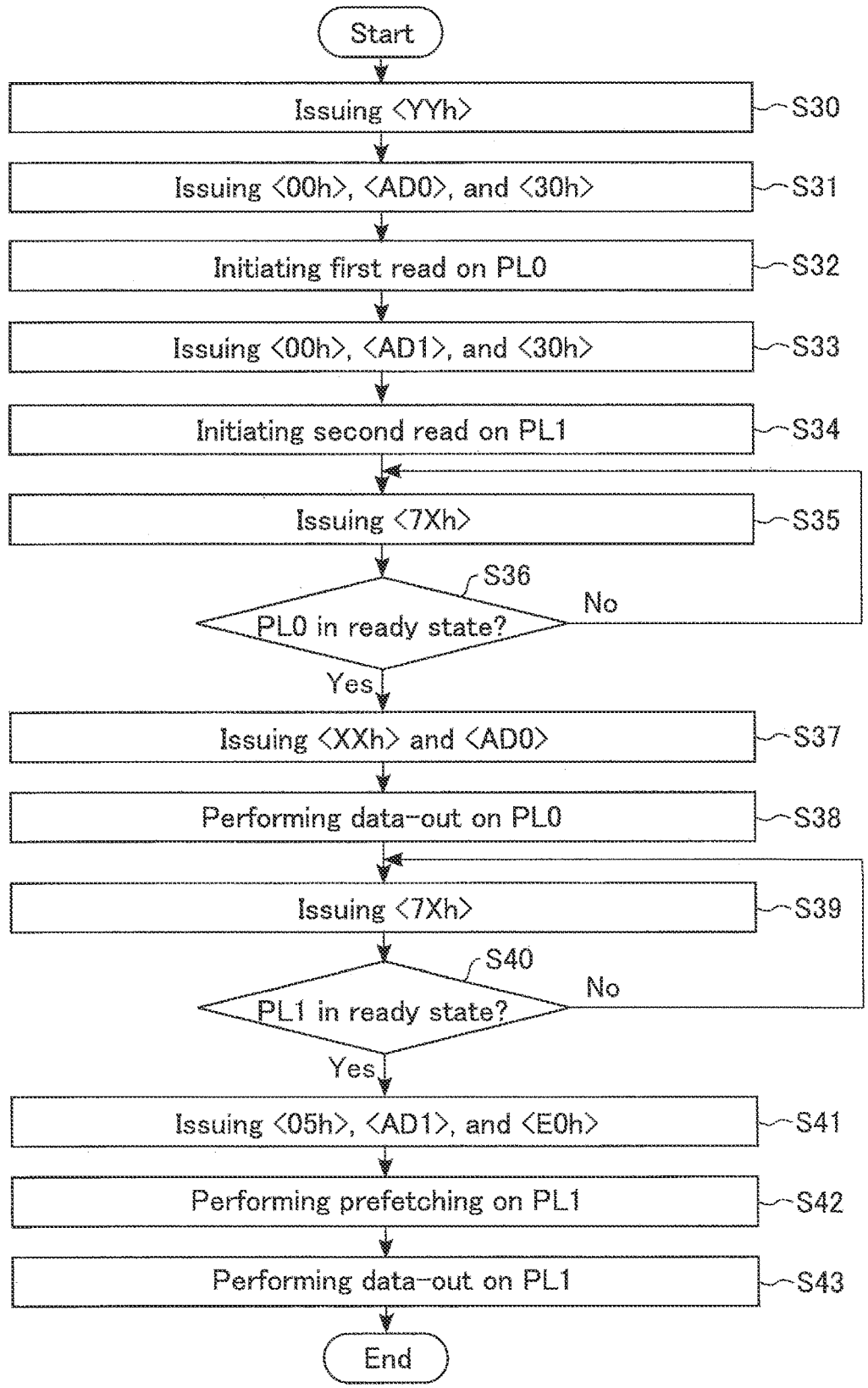
FIG. 11 is a flowchart showing the read operation of the semiconductor memory device according to the modification of the first embodiment.

The operation of the NAND flash memory 10 according to the first embodiment is to perform prefetching on the plane PL0 when the signal CB0 is in a busy state and to perform prefetching on the plane PL1 when the signal CB1 is in a busy state. On the other hand, the operation of the NAND flash memory 10 according to the present modification is to perform prefetching on the plane PL0 when the signal CB0 is in a busy state. Prefetching on the plane PL1 is performed based on a command received from the controller 90. Hereinafter, operations of the NAND flash memory 10 will be described with reference to FIG. 10 and FIG. 11. FIG. 10 is a timing chart of a command sequence and various signals in the case of reading data from the plane PL0 and the plane PL1 of the NAND flash memory 10. FIG. 11 is a flowchart in the case of reading data from the plane PL0 and the plane PL1.

As shown in FIG. 10, at time t1, the controller 90 issues, for example, a command <YYh> (step S30 in FIG. 11). The I/O circuit 11 receives the command <YYh> issued by the controller 90. The command "YYh" is a command for ordering, for example, the NAND flash memory 10 to perform prefetching on the plane PL, which is an object to be read. At time t1, the signal CB0 is in a ready state, the signal CB1 is in a ready state, and the signal RB is in a ready state.

At time t2, the controller 90 issues, for example, the command <00h>, an address <AD0> of the plane PL0, and the command <30h> (step S31 in FIG. 11). The I/O circuit 11 receives the command <00h>, the address <AD0> of the plane PL0, and the command <30h> each issued by the controller 90. At time t2, the signal CB0 is in a ready state, the signal CB1 is in a ready state, and the signal RB is in a ready state.

At time t3, upon receipt of the command "30h" from the command register 53, the sequencer 54 initiates the first read in the plane PL0 (step S32 in FIG. 11). More specifically, the sense amplifier 59A reads the data RD0 from the memory cell array 57A, and transmits the read data RD0 to the data register 60A. Upon initiating the first read, the sequencer 54 sets the signal CB0 to a busy state. The sequencer 54 further performs an OR operation on the signal CB0 at the "L" level and the signal CB1 at the "H" level, and based on a result of the operation, sets the signal RB to a busy state.

At time t4, the controller 90 issues, for example, the command <00h>, an address <AD1> of the plane PL1, and the command <30h> (step S33 in FIG. 11). The I/O circuit 11 receives the command <00h>, the address <AD1> of the plane PL1, and the command <30h> each issued by the controller 90.

At time t5, upon receipt of the command "30h" from the command register 53, the sequencer 54 initiates the second read in the plane PL1 (step S34 in FIG. 11). More specifically, the sense amplifier 59B reads the data RD1 from the memory cell array 57B, and transmits the read data RD1 to the data register 60B. Upon initiating the second read, the sequencer 54 sets the signal CB1 to a busy state. The sequencer 54 further performs an OR operation on the signal CB0 at the "L" level and the signal CB1 at the "L" level, and based on a result of the operation, sets the signal RB to a busy state.

At time t6, in the plane PL0, when reading from the memory cell array 57A is completed, the I/O circuit 11 performs prefetching on the plane PL0 (step S32 in FIG. 11). More specifically, the data input/output selection circuit 17 selects "PL0" and "OUT" based on the command CMD and the address ADD. The data input/output selection circuit 17 receives the data RD0 from the data register 60A, and transmits the received data RD0 to the FIFO circuit 14. The FIFO circuit 14 receives the data RD0 from the data input/output selection circuit 17, and fetches the received data RD0 based on the write clock Wclk.

At time t7, when prefetching on the plane PL0 is completed, the sequencer 54 sets the signal CB0 to a ready state. The sequencer 54 further performs an OR operation on the signal CB0 at the "H" level and the signal CB1 at the "L" level, and based on a result of the operation, sets the signal RB to a busy state.

During a period from time t5 to time t7, the controller 90 issues the command <7Xh> (step S35 in FIG. 11). The I/O circuit 11 receives the command <7Xh> issued by the controller 90.

During the period from time t5 to time t7, upon receipt of the command <7Xh> from the command register 53, the sequencer 54 transmits the signals CB0, CB1, and RB from the status register 51 to the controller 90. If the signal CB0 received by the controller 90 exhibits a ready state (Yes in step S36 in FIG. 11), the controller 90 issues the command <XXh> and the address <AD0> of the plane PL0 (step S37 in FIG. 11). The I/O circuit 11 receives the command <XXh> and the address <AD0> of the plane PL0 each issued by the controller 90. On the other hand, if the signal CB0 received by the controller 90 exhibits a busy state (No in step S36 in FIG. 11), the controller 90 performs step S35 described above.

At time t7, the controller 90 issues the command <7Xh>. At time t8, the signal CB0 is in a ready state, so that the controller 90 issues the command <XXh> and the address <AD0> of the plane PL0.

At time t9, when the address <AD0> that designates the plane PL0 is stored in the address register 52, the I/O circuit 11 outputs the data RD of the plane PL0 from the FIFO circuit 14 to the controller 90 (step S38 in FIG. 11). More specifically, the FIFO circuit 14 transmits the data RD0 to the DQ input/output selection circuit 16 based on the read clock Rclk. The DQ input/output selection circuit 16 selects "OUT" based on the command CMD and the address ADD. The DQ input/output selection circuit 16 receives the data RD0 from the FIFO circuit 14, transmits the received data RD0 to the controller 90.

At time t10, when the second read in the plane PL1 is completed, the sequencer 54 sets the signal CB1 to a ready state. The sequencer 54 further performs an OR operation on the signal CB0 at the "H" level and the signal CB1 at the "H" level, and based on a result of the operation, sets the signal RB to a ready state.

During a period from time t9 to time t12, the controller 90 issues the command <7Xh> (step S39 in FIG. 11). The I/O circuit 11 receives the command <7Xh> issued by the controller 90.

During the period from time t9 to time t12, upon receipt of the command <7Xh> from the command register 53, the sequencer 54 transmits the signals CB0, CB1, and RB from the status register 51 to the controller 90.

During the period from time t9 to time t12, if the signal CB1 received by the controller 90 exhibits a ready state (Yes in step S40 in FIG. 11), the controller 90 issues the command <05h>, the address <AD1> of the plane PL1, and the command <E0h> (step S41 in FIG. 11). The I/O circuit 11 receives the command <05h>, the address <AD1> of the plane PL1, and the command <E0h> each issued by the controller 90. On the other hand, if the signal CB1 received by the controller 90 exhibits a busy state (No in step S40 in FIG. 11), the controller 90 performs step S39 described above.

At time t12, the controller 90 issues the command <7Xh>. At time t14, the signal CB1 is in a ready state, so that the controller 90 issues the command <05h>, the address <AD1> of the plane PL1, and the command <E0h>.

At time t15, the I/O circuit 11 performs prefetching on the plane PL1 (step S42 in FIG. 11). More specifically, the data input/output selection circuit 17 selects "PL1" and "OUT" based on the command CMD and the address ADD. The data input/output selection circuit 17 receives the data RD1 from the data register 60B, and transmits the received data RD1 to the FIFO circuit 14. The FIFO circuit 14 receives the data RD1 from the data input/output selection circuit 17, and fetches the received data RD1 based on the write clock Wclk.

When prefetching on the plane PL1 is completed at time t16, the I/O circuit 11 outputs the data RD1 of the plane PL1 from the FIFO circuit 14 to the controller 90 at time t17 (step S43 in FIG. 11). More specifically, the FIFO circuit 14 transmits the data RD1 to the DQ input/output selection circuit 16 based on the write clock Wclk. The DQ input/output selection circuit 16 selects "OUT" based on the command CMD and the address ADD. The DQ input/output selection circuit 16 receives the data RD1 from the FIFO circuit 14, and transmits the received data RD1 to the controller 90.

1.4.3 Advantageous Effects of Present Modification

The configuration according to the present modification enables continuous execution of prefetching after reading of the data RD0 from the memory cell array 57A to the data register 60A. Accordingly, the NAND flash memory 10 can realize a relatively short preparation period from receipt of the command <XXh> and the address <AD0> of the plane PL0 to initiation of data-out of the data RD0. This can enhance the speed of operations of the semiconductor memory device.

2. Second Embodiment

Next, a semiconductor memory device according to a second embodiment will be described. The semiconductor memory device according to the present embodiment is configured by adding an input path from the controller 90 to the FIFO circuit 14 and an output path from the FIFO circuit 14 to the data register 60 to the I/O circuit 11 according to the modification of the first embodiment. The following description will focus only on the points that differ from the first embodiment.

2.1 Configuration of I/O Circuit 11

Hereinafter, a circuit configuration of the I/O circuit 11 will be described with reference to FIG. 12. FIG. 12 is a circuit diagram showing the I/O circuit 11 according to the present embodiment. In FIG. 12, the signal DQ is indicated by a solid line, while a control signal is indicated by a broken line. FIG. 12 omits arrows indicative of the following: transmission of the command CMD received from the controller 90 to the command register 53; transmission of the address ADD received from the controller 90 to the address register 52; and transmission of the address ADD received from the address register 52 to the controller 90.

As shown in FIG. 12, the I/O circuit 11 includes the FIFO circuit 14, a DQ input/output selection circuit 18, and a data input/output selection circuit 19.

The DQ input/output selection circuit 18 receives, as control signals, a command CMD from the command register 53, and an address ADD from the address register 52. Based on the received command CMD and address ADD, the DQ input/output selection circuit 18 selects one of "IN", "OUT/Input Pre-Processing (INpre)", and "STATUS".

In the case of selecting "OUT/INpre", the DQ input/output selection circuit 18 electrically couples the controller 90 to the FIFO circuit 14. The DQ input/output selection circuit 18 either receives an output signal DQ (data RD) from the FIFO circuit 14 or receives an input signal DQ (data WDsome) from the controller 90. The data WDsome corresponds to some data pieces in data WD. In the case of receiving the data RD from the FIFO circuit 14, the DQ input/output selection circuit 18 transmits the received data RD to the controller 90. In the case of receiving the data WDsome from the controller 90, the DQ input/output selection circuit 18 transmits the received data WDsome to the FIFO circuit 14.

In the case of selecting "IN", the DQ input/output selection circuit 18 electrically couples the controller 90 to the command register 53, the address register 52, or the data input/output selection circuit 19. The DQ input/output selection circuit 18 receives the input signal DQ (the command CMD, the address ADD, or data WDother) from the controller 90. The data WDother is the remaining data pieces excluding the data WDsome in the data WD. In the case of receiving the command CMD as the input signal DQ, the DQ input/output selection circuit 18 transmits the received command CMD to the command register 53. In the case of receiving the address ADD as the input signal DQ, the DQ input/output selection circuit 18 transmits the received address ADD to the address register 52. In the case of receiving the data WDother as the input signal DQ, the DQ input/output selection circuit 18 transmits the received data WDother to the data input/output selection circuit 19.

In the case of selecting "STATUS", the DQ input/output selection circuit 18 electrically couples the controller 90 to the status register 51. The DQ input/output selection circuit 18 receives status information STS from the status register 51, and transmits the received status information STS to the controller 90.

The FIFO circuit 14 fetches, based on a write clock Wclk, the data RD0 of the plane PL0 or the data RD1 of the plane PL1 received from the data input/output selection circuit 19. The FIFO circuit 14 further transmits a signal stored therein to the DQ input/output selection circuit 18 based on a read clock Rclk. The FIFO circuit 14 is the same as the FIFO circuit 14A shown in FIG. 5.

The FIFO circuit 14 fetches, based on the write clock Wclk, data WD0some of the plane PL0 or data WD1some of the plane PL1 received from the DQ input/output selection circuit 18. Furthermore, the FIFO circuit 14 transmits a signal stored therein to the data input/output selection circuit 19 based on the read clock Rclk.

The data input/output selection circuit 19 receives, as control signals, the command CMD from the command register 53 and the address ADD from the address register 52. Based on the received command CMD and address ADD, the data input/output selection circuit 19 selects one of the combinations "PL0" and "IN", "PL0" and "OUT/Input Post-Processing (INpost)", "PL1" and "IN", and "PL1" and "OUT/INpost".

In the case of selecting "PL0" and "OUT/INpost", the data input/output selection circuit 19 electrically couples the data register 60A to the FIFO circuit 14. In the case of receiving the data RD0 of the plane PL0 from the data register 60A, the data input/output selection circuit 19 transmits the received data RD0 to the FIFO circuit 14. In the case of receiving the data WD0some of the plane PL0 from the FIFO circuit 14, the data input/output selection circuit 19 transmits the received data WD0some to the data register 60A.

In the case of selecting "PL0" and "IN", the data input/output selection circuit 19 electrically couples the data register 60A to the DQ input/output selection circuit 18. The data input/output selection circuit 19 receives data WD0other of the plane PL0 from the DQ input/output selection circuit 18, and transmits the received data WD0other to the data register 60A.

In the case of selecting "PL1" and "OUT/INpost", the data input/output selection circuit 19 electrically couples the data register 60B to the FIFO circuit 14. In the case of receiving the data RD1 of the plane PL1 from the data register 60B, the data input/output selection circuit 19 transmits the received data RD1 to the FIFO circuit 14. In the case of receiving the data WD1some of the plane PL1 from the FIFO circuit 14, the data input/output selection circuit 19 transmits the received data WD1some to the data register 60B.

In the case of selecting "PL1" and "IN", the data input/output selection circuit 19 electrically couples the data register 60B to the DQ input/output selection circuit 18. The data input/output selection circuit 19 then receives data WD1other of the plane PL1 from the DQ input/output selection circuit 18, and transmits the received data WD1other to the data register 60B.

2.2 Operation of NAND Flash Memory 10

Figure 13:
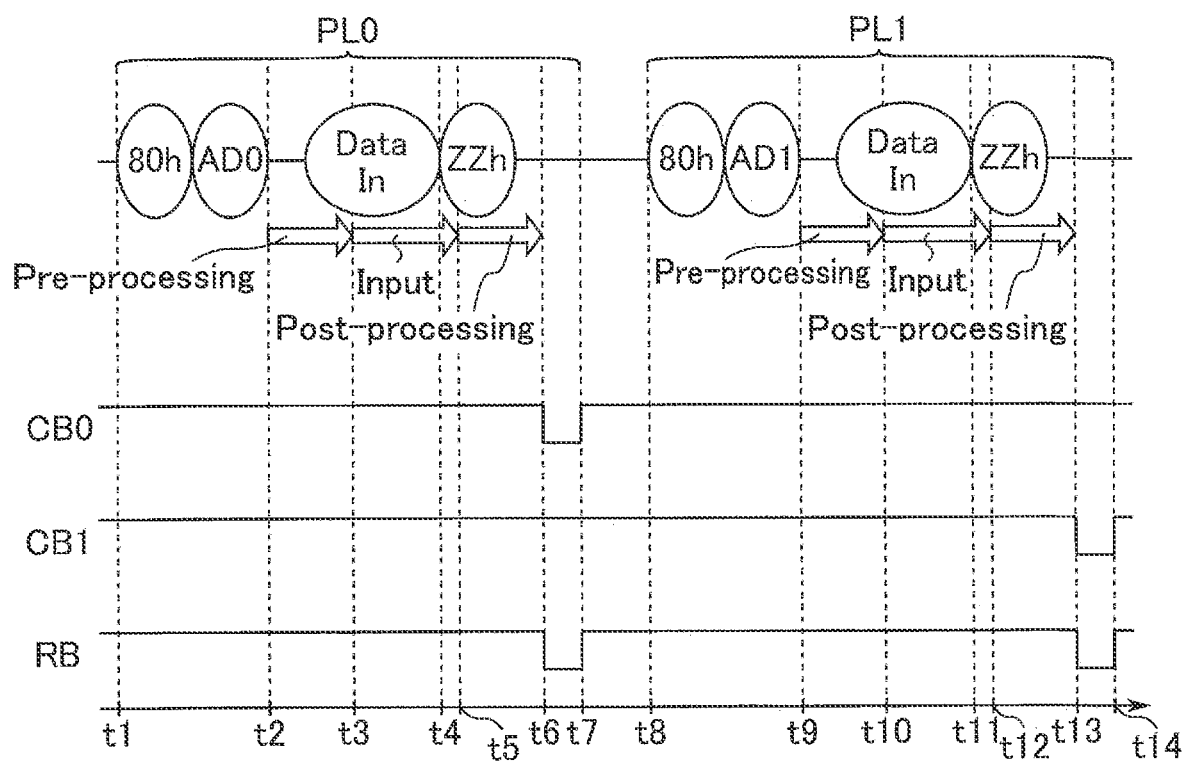
FIG. 13 is a timing chart of a command sequence and various signals during a write operation of the semiconductor memory device according to the second embodiment.
Figure 14:
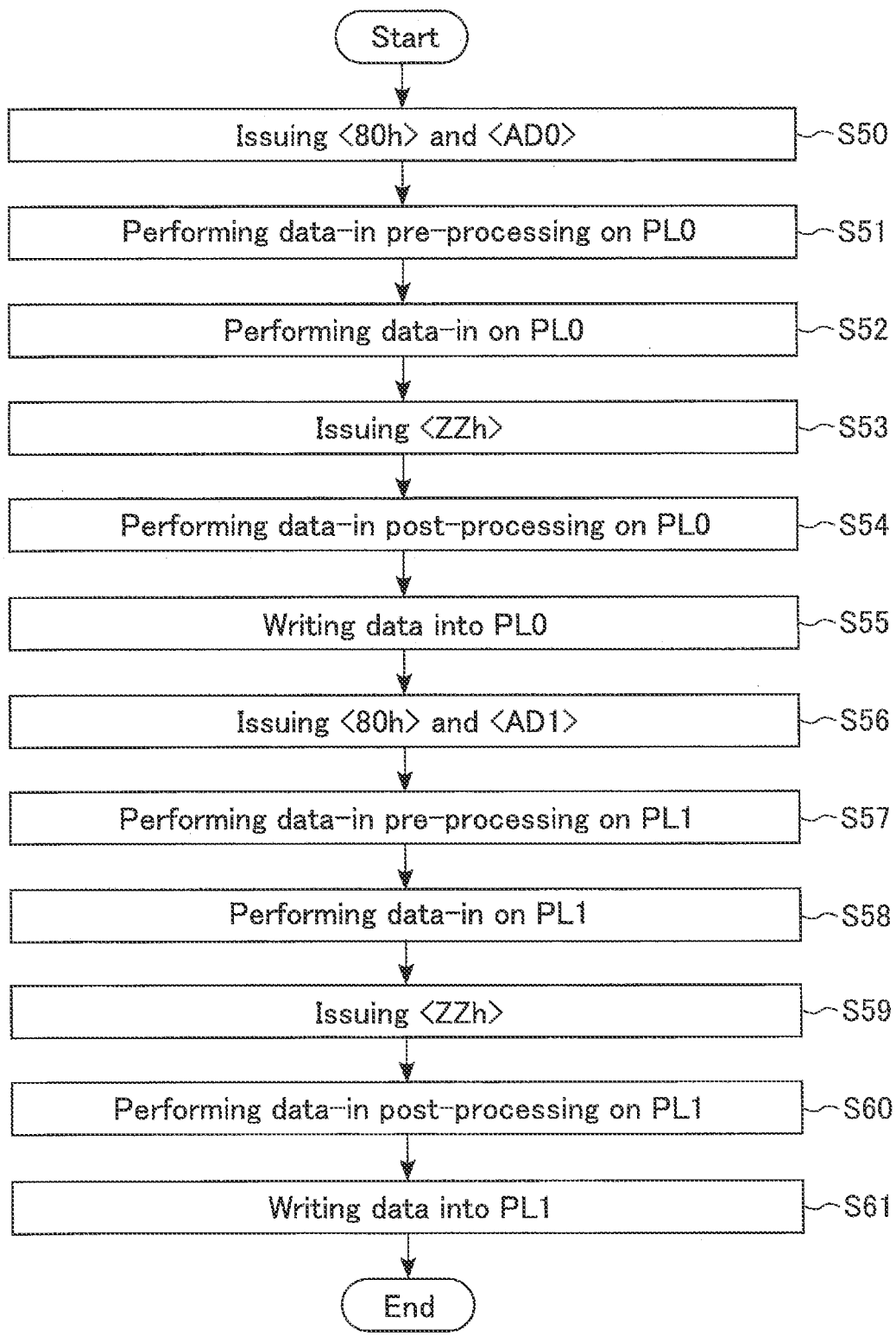
FIG. 14 is a flowchart showing the write operation of the semiconductor memory device according to the second embodiment.

Next, operations of the NAND flash memory 10 will be described with reference to FIG. 13 and FIG. 14. FIG. 13 is a timing chart of a command sequence and various signals in the case of writing data into the plane PL0 and the plane PL1 of the NAND flash memory 10. FIG. 14 is a flowchart in the case of writing data to the plane PL0 and the plane PL1.

As shown in FIG. 13, at time t1, the controller 90 issues, for example, a command <80h> and an address <AD0> of the plane PL0 (step S50 in FIG. 14). The I/O circuit 11 receives the command <80h> and the address <AD0> of the plane PL0 each issued by the controller 90. The command "80h" is a command for ordering, for example, a write operation of writing data into the NAND flash memory 10. The address <AD0> designates, for example, an address of a chip, an address of the plane PL0, an address of a region within the plane PL0, etc.

At time t2, when the address <AD0> that designates the plane PL0 is stored in the address register 52, a clear operation on the data register 60A (for example, a latch circuit XDL) is performed. During this clear operation, the I/O circuit 11 performs data-in pre-processing on the plane PL0 (step S51 in FIG. 14). More specifically, the DQ input/output selection circuit 18 selects "OUT/INpre" based on the command CMD and the address ADD. The DQ input/output selection circuit 18 receives the data WD0some (for example, a head data piece in the data WD0) from the controller 90, and transmits the received data WD0some to the FIFO circuit 14. The FIFO circuit 14 receives the data WD0some from the DQ input/output selection circuit 18, and fetches the received data WD0some based on the write clock Wclk.

At time t3, the I/O circuit 11 performs data-in on the plane PL0 (step S52 in FIG. 14). More specifically, the DQ input/output selection circuit 18 selects "IN" based on the command CMD and the address ADD. The DQ input/output selection circuit 18 receives the data WD0other (for example, data pieces after the head data piece in the data WD0) from the controller 90, and transmits the received data WD0other to the data input/output selection circuit 19. The data input/output selection circuit 19 selects "PL0" and "IN" based on the command CMD and the address ADD. The data input/output selection circuit 19 receives the data WD0other from the DQ input/output selection circuit 18, and transmits the received data WD0other to the data register 60A.

At time t4, the controller 90 issues, for example, a command <ZZh> (step S53 in FIG. 14). The I/O circuit 11 receives the command <ZZh> issued by the controller 90. The command <ZZh> is a command for causing, for example, the NAND flash memory 10 to perform a write operation on data.

At time t5, when transmission of the data WD0other to the data register 60A is completed, the I/O circuit 11 performs data-in post-processing on the PL0 (step S54 in FIG. 14). More specifically, the data input/output selection circuit 19 selects "PL0" and "OUT/INpost" based on the command CMD and the address ADD. The FIFO circuit 14 transmits the data WD0some to the data input/output selection circuit 19 based on the read clock Rclk. The data input/output selection circuit 19 transmits the data WD0some received from the FIFO circuit 14 to the data register 60A.

At time t6, when data-in post-processing on the plane PL0 is completed, the sequencer 54 writes the data WD0 from the data register 60A of the plane PL0 into the memory cell array 57A of the plane PL0 (step S55 in FIG. 14). Upon initiating the write, the sequencer 54 sets the signal CB0 to a busy state. The sequencer 54 further performs an OR operation on the signal CB0 at the "L" level and the signal CB1 at the "H" level, and based on a result of the operation, sets the signal RB to a busy state.

At time t7, when the write in the plane PL0 is completed, the sequencer 54 sets the signal CB0 to a ready state. The sequencer 54 further performs an OR operation on the signal CB0 at the "H" level and the signal CB1 at the "H" level, and based on a result of the operation, sets the signal RB to a ready state.

At time t8, the controller 90 issues, for example, the command <80h> and an address <AD1> of the plane PL1 (step S56 in FIG. 14). The I/O circuit 11 receives the command <80h> and the address <AD1> of the plane PL1 each issued by the controller 90.

At time t9, when the address "AD1" that designates the plane PL1 is stored in the address register 52, the clear operation is performed on the data register 60B (for example, a latch circuit XDL). During this clear operation, the I/O circuit 11 performs a data-in pre-processing on the plane PL1 (step S57 in FIG. 14). More specifically, the DQ input/output selection circuit 18 selects "OUT/INpre" based on the command CMD and the address ADD. The DQ input/output selection circuit 18 receives the data WD1some (for example, a head data piece in the data WD1) from the controller 90 and transmits the received data WD1some to the FIFO circuit 14. The FIFO circuit 14 receives the data WD1some from the DQ input/output selection circuit 18, and fetches the received data WD1some based on the write clock Wclk.

At time t10, the I/O circuit 11 performs data-in on the plane PL1 (step S58 in FIG. 14). More specifically, the DQ input/output selection circuit 18 selects "IN" based on the command CMD and the address ADD. The DQ input/output selection circuit 18 then receives the data WD1other (for example, data pieces after the head data piece in the data WD1) from the controller 90, and transmits the received data WD1other to the data input/output selection circuit 19. The data input/output selection circuit 19 selects "PL1" and "IN" based on the command CMD and the address ADD. The data input/output selection circuit 19 receives the data WD1other from the DQ input/output selection circuit 18, and transmits the received data WD1other to the data register 60B.

At time t11, the controller 90 issues, for example, the command <ZZh> (step S59 in FIG. 14). The I/O circuit 11 receives the command <ZZh> issued by the controller 90.

At time t12, when transmission of the data WD1other to the data register 60B is completed, the I/O circuit 11 performs data-in post-processing on the plane PL1 (step S60 in FIG. 14). More specifically, the data input/output selection circuit 19 selects "PL1" and "OUT/INpost" based on the command CMD and the address ADD. The FIFO circuit 14 transmits the data WD1some to the data input/output selection circuit 19 based on the read clock Rclk. The data input/output selection circuit 19 transmits the data WD1some received from the FIFO circuit 14 to the data register 60B.

At time t13, when data-in post-processing on the plane PL1 is completed, the sequencer 54 writes the data WD1 from the data register 60B of the plane PL1 into the memory cell array 57B of the plane PL1 (step S61 in FIG. 14). Upon initiating the write, the sequencer 54 sets the signal CB1 to a busy state. The sequencer 54 further performs an OR operation on the signal CB0 at the "H" level and the signal CB1 at the "L" level, and based on a result of the operation, sets the signal RB to a busy state.

At time t14, when the write in the plane PL1 is completed, the sequencer 54 sets the signal CB1 to a ready state. The sequencer 54 further performs an OR operation on the signal CB0 at the "H" level and the signal CB1 at the "H" level, and based on a result of the operation, sets the signal RB to a ready state.

2.3 Advantageous Effect of Present Embodiment

The configuration according to the present embodiment can enhance the speed of operations of the semiconductor memory device. This advantageous effect will be described below. FIG. 15 shows, as a comparative example, an exemplary timing chart of a command sequence and various signals in the case of writing data into the plane PL0 and the plane PL1 in a semiconductor memory device in which the I/O circuit 11 contains neither an input path from the controller 90 to the FIFO circuit 14 nor an output path from the FIFO circuit 14 to the data register 60.

As shown in FIG. 15, operations during a period from time t1 to time t2, that is, operations from when the controller 90 issues the command <80h> and the address <AD0> of the plane PL0 to when the address <AD0> that designates the plane PL0 is stored in the address register 52, are the same as those in FIG. 13.

At time t2, when the address <AD0> that designates the plane PL0 is stored in the address register 52, the clear operation is performed on the data register 60A (for example, a latch circuit XDL) during a period Δt2 from time t2 to time t3.

At time t3, when the clear operation on the data register 60A is completed, the I/O circuit 11 performs the data-in on the plane PL0. More specifically, the I/O circuit 11 transmits the data WD0 received from the controller 90 to the data register 60A.

At time t4, the controller 90 issues, for example, the command <ZZh>. The I/O circuit 11 receives the command <ZZh> issued by the controller 90.

At time t5, the data-in on the plane PL0 is completed. Upon receipt of the command "ZZh" from the command register 53, at time t6, the sequencer 54 writes the data WD0 from the data register 60A of the plane PL0 into the memory cell array 57A of the plane PL0. Upon initiating the write, the sequencer 54 sets the signal CB0 to a busy state. The sequencer 54 further performs an OR operation on the signal CB0 at the "L" level and the signal CB1 at the "H" level, and based on a result of the operation, sets the signal RB to a busy state.

At time t7, when the write in the plane PL0 is completed, the sequencer 54 sets the signal CB0 to a ready state. The sequencer 54 further performs an OR operation on the signal CB0 at the "H" level and the signal CB1 at the "H" level, and based on a result of the operation, sets the signal RB to a ready state.

Subsequently, as with the plane PL0, the command <80h> and the address <AD1> of the plane PL1 are issued for the plane PL1, the clear operation on the data register 60B is executed, the data-in is performed, the command <ZZh> is issued, and thereafter, the data WD1 is written from the data register 60B of the plane PL1 into the memory cell array 57B of the plane PL1.

In this case, during the period Δt2 in which the clear operation is performed on the data register 60, that is, a period from when the address <AD0> that designates the plane PL0 is stored in the address register 52 to when the data-in is initiated, the data-in is not performed on the plane PL0. Similarly, the data-in is not performed on the plane PL1 during a period from when the address "AD1" that designates the plane PL1 is stored in the address register 52 to when the data-in is initiated.

On the other hand, in the present embodiment, the I/O circuit 11 contains an input path from the controller 90 to the FIFO circuit 14 and an output path from the FIFO circuit 14 to the data register 60. With this configuration, during the clear operation on the data register 60, the data WDsome, which corresponds to some data pieces in the data WD, is fetched into the FIFO circuit 14. After the data WDsome is fetched, the data WDother, which is the remaining data pieces excluding the data WDsome in the data WD, is transmitted to the data register 60. After this transmission of the data WDother, the data WDsome can be transmitted from the FIFO circuit 14 to the data register 60. Accordingly, the data-in of the data WD on the plane PL0 and the plane PL1 can be completed quickly. This can enhance the speed of operations of the semiconductor memory device. As a matter of course, the present embodiment is applicable to the modification of the first embodiment.

2.4 Modification

Next, a semiconductor memory device according to the modification of the second embodiment will be described. The semiconductor memory device according to the present modification is configured by increasing the number of FIFO circuits 14 within the I/O circuit 11 according to the second embodiment to two, and is configured in such a manner as to include an input path from the controller 90 to the FIFO circuit 14A, an output path from the FIFO circuit 14A to the data register 60A, an input path from the controller 90 to the FIFO circuit 14B, and an output path from the FIFO circuit 14B to the data register 60B. Operations of the NAND flash memory 10 according to the present modification are the same as those in the second embodiment. The following explanation will focus only on the points that differ from the first embodiment and second embodiment.

2.4.1 Configuration of I/O Circuit 11

Hereinafter, a circuit configuration of the I/O circuit 11 will be described with reference to FIG. 16. FIG. 16 is a circuit diagram showing the I/O circuit 11 according to the present modification. In FIG. 16, the signal DQ is indicated by a solid line, while a control signal is indicated by a broken line. FIG. 16 omits arrows indicative of the following: transmission of the command CMD received from the controller 90 to the command register 53; transmission of the address ADD received from the controller 90 to the address register 52; and transmission of the address ADD received from the address register 52 to the controller 90.

As shown in FIG. 16, the I/O circuit 11 includes FIFO circuits 14A and 14B, a DQ input/output selection circuit 20, a PL selection circuit 21, and data input/output selection circuits 22A and 22B.

The DQ input/output selection circuit 20 is the same as the DQ input/output selection circuit 12 shown in FIG. 4.

The PL selection circuit 21 receives, as control signals, a command CMD from the command register 53 and an address ADD from the address register 52. Based on the received command CMD and address ADD, the PL selection circuit 21 selects one of the combinations "PL0" and "IN", "PL0" and "OUT/INpre", "PL1" and "IN", and "PL1" and "OUT/INpre".

In the case of selecting "PL0" and "OUT/INpre", the PL selection circuit 21 electrically couples the DQ input/output selection circuit 20 to the FIFO circuit 14A. In the case of receiving data RD0 from the FIFO circuit 14A, the PL selection circuit 21 transmits the received RD0 to the DQ input/output selection circuit 20. In the case of receiving data WD0 from the DQ input/output selection circuit 20, the PL selection circuit 21 transmits to the FIFO circuit 14A the data WD0some, which corresponds to some data pieces in the received data WD0.

In the case of selecting "PL0" and "IN", the PL selection circuit 21 electrically couples the DQ input/output selection circuit 20 to the data input/output selection circuit 22A. The PL selection circuit 21 then receives the data WD0 from the DQ input/output selection circuit 20, and transmits to the data input/output selection circuit 22A the data WD0other, which are the remaining data pieces excluding the data WD0some in the received data WD0.

In the case of selecting "PL1" and "OUT/INpre", the PL selection circuit 21 electrically couples the DQ input/output selection circuit 20 to the FIFO circuit 14B. In the case of receiving data RD1 from the FIFO circuit 14B, the PL selection circuit 21 transmits the received data RD1 to the DQ input/output selection circuit 20. In the case of receiving data WD1 from the DQ input/output selection circuit 20, the PL selection circuit 21 transmits to the FIFO circuit 14B the data WD1some, which corresponds to some data pieces in the received data WD1.

In the case of selecting "PL1" and "IN", the PL selection circuit 21 electrically couples the DQ input/output selection circuit 20 to the data input/output selection circuit 22B. The PL selection circuit 21 then receives the data WD1 from the DQ input/output selection circuit 20, and transmits to the data input/output selection circuit 22B the data WD1other, which are the remaining data pieces excluding the data WD1some in the received data WD1.

The FIFO circuit 14A fetches, based on the write clock Wclk, the data RD0 of the plane PL0 received from the data input/output selection circuit 22A. The FIFO circuit 14A further transmits a signal stored therein to the PL selection circuit 21 based on the read clock Rclk. The FIFO circuit 14A is the same as the FIFO circuit 14A shown in FIG. 5.

The FIFO circuit 14A fetches, based on the write clock Wclk, the data WD0some of the plane PL0 received from the PL selection circuit 21. The FIFO circuit 14A further transmits a signal stored therein to the data input/output selection circuit 22A based on the read clock Rclk.

The FIFO circuit 14B fetches, based on the write clock Wclk, the data RD1 of the plane PL1 received from the data input/output selection circuit 22B. The FIFO circuit 14B further transmits a signal stored therein to the PL selection circuit 21 based on the read clock Rclk. The FIFO circuit 14B is the same as the FIFO circuit 14A shown in FIG. 5. The FIFO circuit 14B may differ from the FIFO circuit 14A.

The FIFO circuit 14B fetches, based on the write clock Wclk, the data WD1some of the plane PL1 received from the PL selection circuit 21. The FIFO circuit 14B further transmits a signal stored therein to the data input/output selection circuit 22B based on the read clock Rclk.

The data input/output selection circuit 22A receives, as control signals, the command CMD from the command register 53 and the address ADD from the address register 52. Based on the received command CMD and address ADD, the data input/output selection circuit 22A selects "IN" or "OUT/INpost".

In the case of selecting "OUT/INpost", the data input/output selection circuit 22A electrically couples the data register 60A to the FIFO circuit 14A. In the case of receiving the data RD0 of the plane PL0 from the data register 60A, the data input/output selection circuit 22A transmits the received data RD0 to the FIFO circuit 14A. In the case of receiving the data WD0some of the plane PL0 from the FIFO circuit 14A, the data input/output selection circuit 22A transmits the received data WD0some to the data register 60A.

In the case of selecting "IN", the data input/output selection circuit 22A electrically couples the data register 60A to the PL selection circuit 21. The data input/output selection circuit 22A receives the data WD0other of the plane PL0 from the PL selection circuit 21, and transmits the received data WD0other to the data register 60A.

The data input/output selection circuit 22B receives, as control signals, the command CMD from the command register 53 and the address ADD from the address register 52. Based on the received command CMD and address ADD, the data input/output selection circuit 22B selects "IN" or "OUT/INpost".

In the case of selecting "OUT/INpost", the data input/output selection circuit 22B electrically couples the data register 60B to the FIFO circuit 14B. In the case of receiving the data RD1 of the plane PL1 from the data register 60B, the data input/output selection circuit 22B transmits the received data RD1 to the FIFO circuit 14B. In the case of receiving the data WD1some of the plane PL1 from the FIFO circuit 14B, the data input/output selection circuit 22B transmits the received data WD1some to the data register 60B.

In the case of selecting "IN", the data input/output selection circuit 22B electrically couples the data register 60B to the PL selection circuit 21. The data input/output selection circuit 22B receives the data WD1other of the plane PL1 from the PL selection circuit 21, and transmits the received data WD1other to the data register 60B.

2.4.2 Advantageous Effects of Present Modification

As in the second embodiment, the configuration according to the present modification can enhance the speed of operations of the semiconductor memory device. As a matter of course, the present modification is applicable to the first embodiment.

3. Third Embodiment

Next, a semiconductor memory device according to a third embodiment will be described. The semiconductor memory device according to the present embodiment is configured by adding a selection circuit for selecting status information STSrb of the signal RB to the I/O circuit 11 according to the modification of the first embodiment. The following description will focus only on the points that differ from the first embodiment.

3.1 Configuration of I/O Circuit 11

Hereinafter, a circuit configuration of the I/O circuit 11 will be described with reference to FIG. 17. FIG. 17 is a circuit diagram showing the I/O circuit 11 according to the present embodiment. In FIG. 17, the signal DQ is indicated by a solid line, while a control signal is indicated by a broken line. FIG. 17 omits arrows indicative of the following: transmission of the command CMD received from the controller 90 to the command register 53; transmission of the address ADD received from the controller 90 to the address register 52; and transmission of the address ADD received from the address register 52 to the controller 90.

As shown in FIG. 17, the I/O circuit 11 includes the FIFO circuit 14, a DQ input/output selection circuit 23, a status selection circuit 24, and a data input/output selection circuit 25.

The DQ input/output selection circuit 23 receives, as control signals, a command CMD from the command register 53, and an address ADD from the address register 52.

Based on the received command CMD and address ADD, the DQ input/output selection circuit 23 selects one of "IN", "OUT", "STATUS"', and "STATUS"'".

In the case of selecting "IN", the DQ input/output selection circuit 23 electrically couples the controller 90 to the command register 53, the address register 52, or the data input/output selection circuit 25. The DQ input/output selection circuit 23 then receives an input signal DQ (a command CMD, an address ADD, or data WD) from the controller 90. In the case of receiving the command CMD as an input signal, the DQ input/output selection circuit 23 transmits the received command CMD to the command register 53. In the case of receiving the address ADD as an input signal, the DQ input/output selection circuit 23 transmits the received address ADD to the address register 52. In the case of receiving the data WD as an input signal, the DQ input/output selection circuit 23 transmits the received data WD to the data input/output selection circuit 25.

In the case of selecting "OUT", the DQ input/output selection circuit 23 electrically couples the controller 90 to the FIFO circuit 14. The DQ input/output selection circuit 23 receives an output signal DQ (data RD) from the FIFO circuit 14, and transmits the received data to the controller 90.

In the case of selecting "STATUS"'", the DQ input/output selection circuit 23 electrically couples the controller 90 to the status selection circuit 24. The DQ input/output selection circuit 23 receives the status information STSrb of the signal RB from the status selection circuit 24, and transmits the received status information STSrb to the controller 90.

In the case of selecting "STATUS"'", the DQ input/output selection circuit 23 electrically couples the controller 90 to the status selection circuit 24. The DQ input/output selection circuit 23 receives the status information STS' which is a remainder excluding the status information of the signal RB from the status selection circuit 24, and transmits the received status information STS' to the controller 90.

The status selection circuit 24 receives, as control signals, the command CMD from the command register 53 and the address ADD from the address register 52. Based on the received command CMD and address ADD, the status selection circuit 24 selects "STATUS"'" or "STATUS"'".

In the case of selecting "STATUS"'", the status selection circuit 24 electrically couples the DQ input/output selection circuit 23 to the status register 51. The status selection circuit 24 receives the status information STSrb of the signal RB from the status register 51, and transmits the received status information STSrb to the DQ input/output selection circuit 23.

In the case of selecting "STATUS"'", the status selection circuit 24 electrically couples the DQ input/output selection circuit 23 to the status register 51. The status selection circuit 24 receives the status information STS' which is a remainder excluding the status information of the signal RB from the status register 51, and transmits the received status information STS' to the DQ input/output selection circuit 23.

The FIFO circuit 14 is the same as the FIFO circuit 14A shown in FIG. 9. The data input/output selection circuit 25 is the same as the data input/output selection circuit 17 shown in FIG. 9.

3.2 Operation of NAND Flash Memory 10

Figure 18:
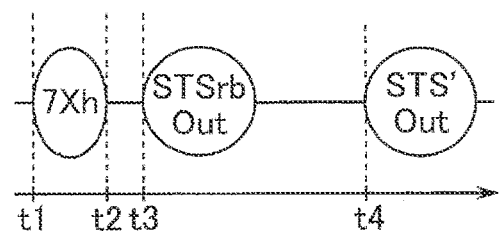
FIG. 18 is a timing chart of a command sequence and various signals during a status read operation of the semiconductor memory device according to the third embodiment.
Figure 19:
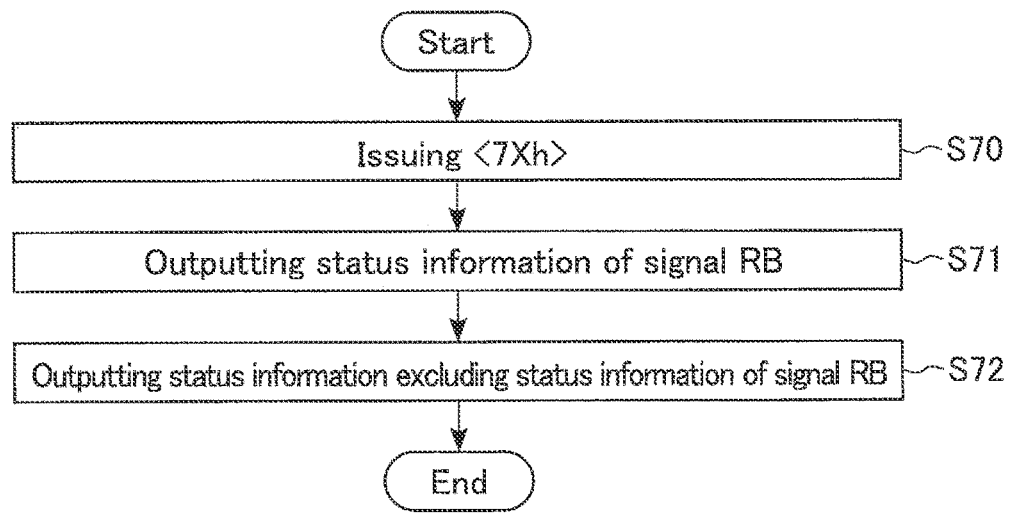
FIG. 19 is a flowchart showing the status read operation of the semiconductor memory device according to the third embodiment.

Next, operations of the NAND flash memory 10 will be described with reference to FIG. 18 and FIG. 19. FIG. 18 is a timing chart of a command sequence and various signals in the case of outputting the status information STSrb of the signal RB in a status read of the NAND flash memory 10. FIG. 19 is a flowchart in the case of outputting the status information STSrb of the signal RB in the status read.

As shown in FIG. 18, at time t1, the controller 90 issues, for example, the command <7Xh> (step S70 in FIG. 19). The I/O circuit 11 receives the command <7Xh> issued by the controller 90.

When the sequencer 54 receives the command "7Xh" from the command register 53 at time t2, the I/O circuit 11 outputs the status information STSrb of the signal RB at time t3 (step S71 in FIG. 19). More specifically, the status selection circuit 24 selects "STATUS"'" based on the command CMD and the address ADD. The status selection circuit 24 then receives the status information STSrb of the signal RB from the status register 51, and transmits the received status information STSrb to the DQ input/output selection circuit 23. The DQ input/output selection circuit 23 selects "STATUS"'" based on the command CMD and the address ADD. The DQ input/output selection circuit 23 receives the status information STSrb from the status selection circuit 24, and transmits the received status information STSrb to the controller 90.

At time t4, upon receipt of a response to the command "7Xh", the I/O circuit 11 outputs the status information STS' which is a remainder excluding the status information of the signal RB (step S72 in FIG. 19). More specifically, the status selection circuit 24 selects "STATUS"'" based on the command CMD and the address ADD. The status selection circuit 24 receives the status information STS' which is a remainder excluding the status information of the signal RB from the status register 51, and transmits the received status information STS' to the DQ input/output selection circuit 23. The DQ input/output selection circuit 23 selects "STATUS"'" based on the command CMD and the address ADD. The DQ input/output selection circuit 23 receives the status information STS' from the status selection circuit 24, and transmits the received status information STS' to the controller 90.

3.3 Advantageous Effects of Present Embodiment

Figure 20:
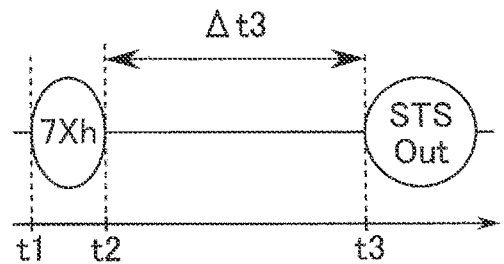
FIG. 20 is a diagram illustrating a period until the I/O circuit receives status information.

The configuration according to the present embodiment can enhance the speed of operations of the semiconductor memory device. This advantageous effect will be described below. FIG. 20 shows, as a comparative example, an exemplary timing chart of a command sequence and various signals in the case of performing the status read of a semiconductor memory device in which the I/O circuit 11 does not contain a selection circuit for selecting the status information STSrb of the signal RB.

As shown in FIG. 20, operations during a period from time t1 to time t2, that is, operations from when the controller 90 issues the command <7Xh> to when the sequencer 54 receives the command "7Xh" from the command register 53 are the same as those shown in FIG. 18.

At time t3, upon receipt of a response to the command "7Xh", that is, the status information STS from the command register 53, the I/O circuit 11 outputs the received status information STS.

This case raises the possibility that a period Δt3 up to the point when the I/O circuit 11 receives the status information STS from the command register 53 will occur due to delays in a combinational circuit (not shown) in the NAND flash memory 10.

In the event of the occurrence of the period Δt3, that is, a period from when the sequencer 54 receives the command "7Xh" from the command register 53 to when the status-out is initiated, the controller 90 is unable to issue a next command during this period Δt3.

On the other hand, according to the present embodiment, the I/O circuit 11 contains the status selection circuit 24 for selecting the status information STSrb of the signal RB. This configuration allows the I/O circuit 11 to transmit the status information STSrb to the controller 90 without waiting for a response to the command "7Xh". Accordingly, the controller 90 can issue a next command. This can enhance the speed of operations of the semiconductor memory device. As a matter of course, the present embodiment is applicable to the modification of the first embodiment and the second embodiment.

4. Modifications, Etc.

As described above, the semiconductor memory device according to the embodiments includes: a first plane (PL0) including a first memory cell array (57A) and a first latch circuit (60A), the first memory cell array having a plurality of first memory cell transistors, the first latch circuit being configured to store first read data (RD0) read from the first memory cell array; a second plane (PL1) including a second memory cell array (57B) and a second latch circuit (60B), the second memory cell array having a plurality of second memory cell transistors, the second latch circuit being configured to store second read data (RD1) read from the second memory cell array; and an I/O circuit (11) including a first FIFO circuit (14A) configured to fetch the first read data from the first latch circuit, and a second FIFO circuit (14B) configured to fetch the second read data from the second latch circuit.

The embodiments are not limited to the above-described embodiments, and various modifications can be made.

The above embodiments are independently implementable. On the other hand, the first to third are implementable in combination.

Furthermore, the FIFO circuit may be a first in, last out (FILO) circuit.

Moreover, in the above-described embodiment, a NAND flash memory was described as an example of a semiconductor memory device; however, the embodiment is not limited to a NAND flash memory, and is applicable to other semiconductor memories in general. Furthermore, the present embodiment is applicable to various memory devices other than a semiconductor memory. Furthermore, the order of the steps in the above-described flowchart may be altered as much as possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first plane including a first memory cell array and a first latch circuit, the first memory cell array having a plurality of first memory cell transistors, and the first latch circuit being configured to store first read data read from the first memory cell array;
a second plane including a second memory cell array and a second latch circuit, the second memory cell array having a plurality of second memory cell transistors, and the second latch circuit being configured to store second read data read from the second memory cell array; and
an I/O circuit including a first FIFO circuit configured to fetch the first read data from the first latch circuit, and a second FIFO circuit configured to fetch the second read data from the second latch circuit,
wherein in a first read operation to read the first read data from the first memory cell array of the first plane, the first plane is set to a busy state during a period from when reading of the first read data is initiated to when the first read data stored in the first latch circuit is fetched into the first FIFO circuit.

2. The device according to claim 1, wherein in a second read operation to read the second read data from the second memory cell array of the second plane, the second plane is set to a busy state during a period from when reading of the second read data is initiated to when the second read data stored in the second latch circuit is fetched into the second FIFO circuit.

3. A semiconductor memory device comprising:
a first plane including a first memory cell array and a first latch circuit, the first memory cell array having a plurality of first memory cell transistors, and the first latch circuit being configured to store first read data read from the first memory cell array;
a second plane including a second memory cell array and a second latch circuit, the second memory cell array having a plurality of second memory cell transistors, and the second latch circuit being configured to store second read data read from the second memory cell array; and
an I/O circuit including a first FIFO circuit configured to fetch the first read data from the first latch circuit, and a second FIFO circuit configured to fetch the second read data from the second latch circuit,
wherein:
in a case where the I/O circuit receives a first command set, the first plane is set to a busy state while the first read data is read from the first memory cell array into the first latch circuit and is subsequently fetched from the first latch circuit into the first FIFO circuit; and
in a case where the I/O circuit receives a second command set during a period in which the first plane is in a busy state, the second plane is set to a busy state while the second read data is read from the second memory cell array into the second latch circuit and is subsequently fetched from the second latch circuit into the second FIFO circuit.

4. The device according to claim 3, wherein:
the first command set includes a read command and an address of the first memory cell array; and
the second command set includes the read command and an address of the second memory cell array.

5. A semiconductor memory device comprising:
a first plane including a first memory cell array and a first latch circuit, the first memory cell array having a plurality of first memory cell transistors, and the first latch circuit being configured to store first read data read from the first memory cell array;
a second plane including a second memory cell array and a second latch circuit, the second memory cell array having a plurality of second memory cell transistors, and the second latch circuit being configured to store second read data read from the second memory cell array; and an I/O circuit including a first FIFO circuit configured to fetch the first read data from the first latch circuit, and a second FIFO circuit configured to fetch the second read data from the second latch circuit, wherein:

the first latch circuit is further configured to store first write data to be written into the first memory cell array;

the second latch circuit is further configured to store second write data to be written into the second memory cell array;

the first FIFO circuit is further configured to fetch the first write data;

the second FIFO circuit is further configured to fetch the second write data; and in a first write operation to write the first write data into the first memory cell array of the first plane:
  a first portion of the first write data is fetched into the first FIFO circuit;
  after the first portion is fetched into the first FIFO circuit, a second portion different from the first portion of the first write data is transmitted to the first latch circuit; and
  after the second portion is transmitted to the first latch circuit, the first portion of the first write data is transmitted from the first FIFO circuit to the first latch circuit.

6. The device according to claim 5, wherein in a second write operation to write the second write data into the second memory cell array of the second plane:

a third portion of the second write data is fetched into the second FIFO circuit;

after the third portion is fetched into the second FIFO circuit, a fourth portion different from the third portion of the second write data is transmitted to the second latch circuit; and after the fourth portion is transmitted to the second latch circuit, the third portion of the second write data is transmitted from the second FIFO circuit to the second latch circuit.

7. A semiconductor memory device comprising:

a first plane including a first memory cell array and a first latch circuit, the first memory cell array having a plurality of first memory cell transistors, and the first latch circuit being configured to store first read data read from the first memory cell array;

a second plane including a second memory cell array and a second latch circuit, the second memory cell array having a plurality of second memory cell transistors, and the second latch circuit being configured to store second read data read from the second memory cell array; and an I/O circuit including a first FIFO circuit configured to fetch the first read data from the first latch circuit and to fetch the second read data from the second latch circuit, wherein in a first read operation to read the first read data from the first memory cell array of the first plane, the first plane is set to a busy state during a period from when reading of the first read data is initiated to when the first read data stored in the first latch circuit is fetched into the first FIFO circuit.

8. The device according to claim 7, wherein:

in a case where the I/O circuit receives a first command set, the first plane is set to a busy state while the first read data is read from the first memory cell array into the first latch circuit and is subsequently fetched from the first latch circuit into the first FIFO circuit; and in a case of receiving a second command set during a period in which the first plane is in a busy state, the second plane is set to a busy state while the second read data is read from the second memory cell array into the second latch circuit.

9. The device according to claim 8, wherein:

the first command set includes a prefetch command, a read command, and an address of the first memory cell array; and the second command set includes the read command and an address of the second memory cell array.

10. The device according to claim 8, wherein:

in a case where the I/O circuit receives a third command set, the first read data is output from the first FIFO circuit to an outside; and in a case where the I/O circuit receives a fourth command set, the second read data is fetched from the second latch circuit into the first FIFO circuit and is subsequently output from the first FIFO circuit to the outside.

11. The device according to claim 10, wherein:

the third command set includes a first data-out command and an address of the first memory cell array; and the fourth command set includes a second data-out command different from the first data-out command and an address of the second memory cell array.

12. A semiconductor memory device comprising:

a first plane including a first memory cell array and a first latch circuit, the first memory cell array having a plurality of first memory cell transistors, and the first latch circuit being configured to store first write data to be written into the first memory cell array;

a second plane including a second memory cell array and a second latch circuit, the second memory cell array having a plurality of second memory cell transistors, and the second latch circuit being configured to store second write data to be written into the second memory cell array; and an I/O circuit including a first FIFO circuit configured to fetch the first write data and the second write data, wherein in a first write operation to write the first write data into the first memory cell array of the first plane:
  a first portion of the first write data is fetched into the first FIFO circuit;
  after the first portion is fetched into the first FIFO circuit, a second portion different from the first portion of the first write data is transmitted to the first latch circuit; and
  after the second portion is transmitted to the first latch circuit, the first portion of the first write data is transmitted from the first FIFO circuit to the first latch circuit.

13. The device according to claim 12, wherein in a second write operation to write the second write data into the second memory cell array of the second plane:

a third portion of the second write data is fetched into the first FIFO circuit;

after the third portion is fetched into the first FIFO circuit, a fourth portion different from the third portion of the second write data is transmitted to the second latch circuit; and after the fourth portion is transmitted to the second latch circuit, the third portion of the second write data is transmitted from the first FIFO circuit to the second latch circuit.

14. A semiconductor memory device comprising:

a first plane including a first memory cell array and a first latch circuit, the first memory cell array having a plurality of first memory cell transistors, and the first latch circuit being configured to store first read data read from the first memory cell array;

a second plane including a second memory cell array and a second latch circuit, the second memory cell array having a plurality of second memory cell transistors, and the second latch circuit being configured to store second read data read from the second memory cell array;

an I/O circuit including a first FIFO circuit configured to fetch the first read data from the first latch circuit and to fetch the second read data from the second latch circuit; and a selection circuit configured to select first status information including a ready/busy signal or second status information not including the first status information.

15. The device according to claim 14, wherein:

the first status information is output from the semiconductor memory device without responding to a command for reading status information; and after the first status information is output, the second status information is output from the semiconductor memory device in response to the command.

* * * * *